(12) United States Patent
Manosalvas-Kjono et al.

(10) Patent No.: US 11,192,779 B2
(45) Date of Patent: Dec. 7, 2021

(54) METHOD AND APPARATUS FOR EVALUATING ELECTROSTATIC OR NONLINEAR DEVICES

(71) Applicant: The Board of Trustees of the Leland Stanford Junior University, Stanford, CA (US)

(72) Inventors: Sandra Manosalvas-Kjono, Stanford, CA (US); Ronald Quan, Cupertino, CA (US); Olav Solgaard, Stanford, CA (US); Zhanghao Sun, Redwood City, CA (US)

(73) Assignee: The Board of Trustees of the Leland Stanford Junior University, Stanford, CA (US)

( * ) Notice: Subject to any disclaimer, the term of this patent is extended or adjusted under 35 U.S.C. 154(b) by 189 days.

(21) Appl. No.: 16/270,374

(22) Filed: Feb. 7, 2019

(65) Prior Publication Data

US 2019/0241427 A1 Aug. 8, 2019

Related U.S. Application Data

(60) Provisional application No. 62/627,613, filed on Feb. 7, 2018, provisional application No. 62/745,118, filed on Oct. 12, 2018.

(51) Int. Cl.
*B81B 3/00* (2006.01)
*B81B 7/00* (2006.01)
(Continued)

(52) U.S. Cl.
CPC ............ *B81B 7/008* (2013.01); *B81B 3/0021* (2013.01); *B81B 7/02* (2013.01); *B81C 99/003* (2013.01);
(Continued)

(58) Field of Classification Search
None
See application file for complete search history.

(56) References Cited

U.S. PATENT DOCUMENTS

| 8,528,404 | B2 | 9/2013 | Ayazi |
| 2004/0070400 | A1* | 4/2004 | van Spengen ........... H01G 5/16 |
| | | | 324/457 |
| 2009/0139342 | A1 | 6/2009 | Robert et al. |

FOREIGN PATENT DOCUMENTS

| WO | 2012129427 A2 | 9/2012 |
| WO | 2013059071 A1 | 4/2013 |

OTHER PUBLICATIONS

A. Trusov and A. M. Shkel, "Parallel Plate Capacitive Detection of Large Amplitude Motion in MEMS," in The 14th International Conference on Solid-State Sensors, Actuators and Microsystems. Lyon, France: IEEE, 2007, pp. 1693-1696.
(Continued)

*Primary Examiner* — Reema Patel
(74) *Attorney, Agent, or Firm* — Crawford Maunu PLLC

(57) ABSTRACT

Aspects are directed to a MEMS device configurable to receive signals from a first, a second, a third, and a fourth signal source operating at a first, a second, a third, and a fourth frequency, respectively. The MEMS device may be configured to combine the first signal with the second signal generating a first combined signal, and to combine the third signal with the fourth signal generating a second combined signal. The first combined signal may be coupled to the first terminal of the MEMS device while the second combined signal may be coupled to the second terminal of the MEMS device. The first common terminal may be configured to produce an output associated with the second and fourth frequencies. The MEMS device may be further configured to
(Continued)

derive from the produced output a signal indicative of nonlinearities or of changes in capacitance related to the MEMS device.

26 Claims, 19 Drawing Sheets

(51) Int. Cl.
  *B81B 7/02* (2006.01)
  *B81C 99/00* (2010.01)
(52) U.S. Cl.
  CPC ... *B81B 2201/038* (2013.01); *B81B 2201/042* (2013.01)

(56) References Cited

OTHER PUBLICATIONS

J. Dong and P. M. Ferreira, "Simultaneous actuation and displacement sensing for electrostatic drives," Journal of Micromechanics and Microengineering, vol. 18, pp. 35 011-10, 2008. [Online]. Available: http://iopscience.iop.org/0960-1317/18/3/035011.

A. Tortschanoff, T. Sandner, and A. Kenda, "Design of an optical position detection unit for fast 2D-MOEMS scanners," Proc. of SPIE, vol. 8550, No. 85501F, pp. 85 501F-1-9, 2012. [Online]. Available: http://proceedings.spiedigitallibrary.org/proceeding.aspx?doi=10.1117/12.979930.

J. W. Jeong, S. Kim, and O. Solgaard, "Split-frame gimbaled two-dimensional MEMS scanner for miniature dual-axis confocal microendo-scopes fabricated by front-side processing," Journal of Microelectrome-chanical Systems, vol. 21, No. 2, pp. 308-315, 2012.

U. Hofmann, F. Senger, F. Soerensen, V. Stenchly, B. Jensen, and J. Janes, "Biaxial resonant 7mm-MEMS mirror for automotive LIDAR applica-tion," International Conference on Optical MEMS and Nanophotonics, vol. 5, No. figure 1, pp. 150-151, 2012.

O. Solgaard, A. A. Godil, R. T. Howe, L. P. Lee, Y. A. Peter, and H. Zappe, "Optical MEMS: From micromirrors to complex systems," Journal of Microelectromechanical Systems, vol. 23, No. 3, pp. 517-538, 2014.

Steven L. Moore and S. O. Reza Moheimani, "Simultaneous Actuation and Sensing for Electrostatic Drives in MEMS using Frequency Modulated Capacitive Sensing," IFA Proceedings vol. 47, Issue 3, 2014, pp. 6545-6549.

H. Chen, A. Chen, W. J. Sun, Z. D. Sun, and J. T. Yeow, "Closed-loop control of a 2-D mems micromirror with sidewall electrodes for a laser scanning microscope system," International Journal of Optomechatronics, vol. 10, No. 1, pp. 1-13, 2016. [Online]. Available: http://www.tandfonline.com/doi/full/10.1080/15599612.2015.1095956.

R. Forke et al. Electrostatic force coupling of MEMS oscillators for spectral vibration measurements. Sensors and Actuators A: Physical. Volume 142, Issue 1, Mar. 10, 2008, pp. 276-283.

Ramanan A, Teoh YX, Ma W, Ye W Characterization of a Laterally Oscillating Microresonator Operating in the Nonlinear Region. Micromachines (Basel). 2016;7(8):132, published Aug. 2, 2016.

K. Tao et al. Out-of-plane electret-based MEMS energy harvester with the combined nonlinear effect from electrostatic force and a mechanical elastic stopper. J. Micromech. Microeng. 25 (2015) 104014 (11pp).

* cited by examiner

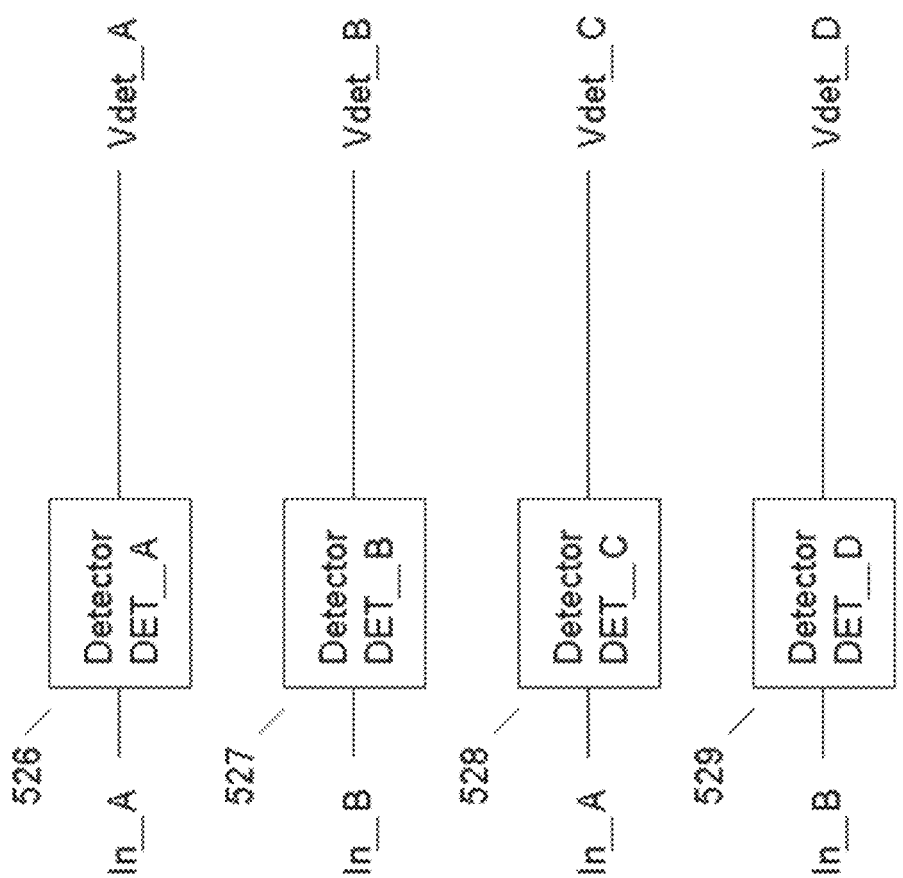

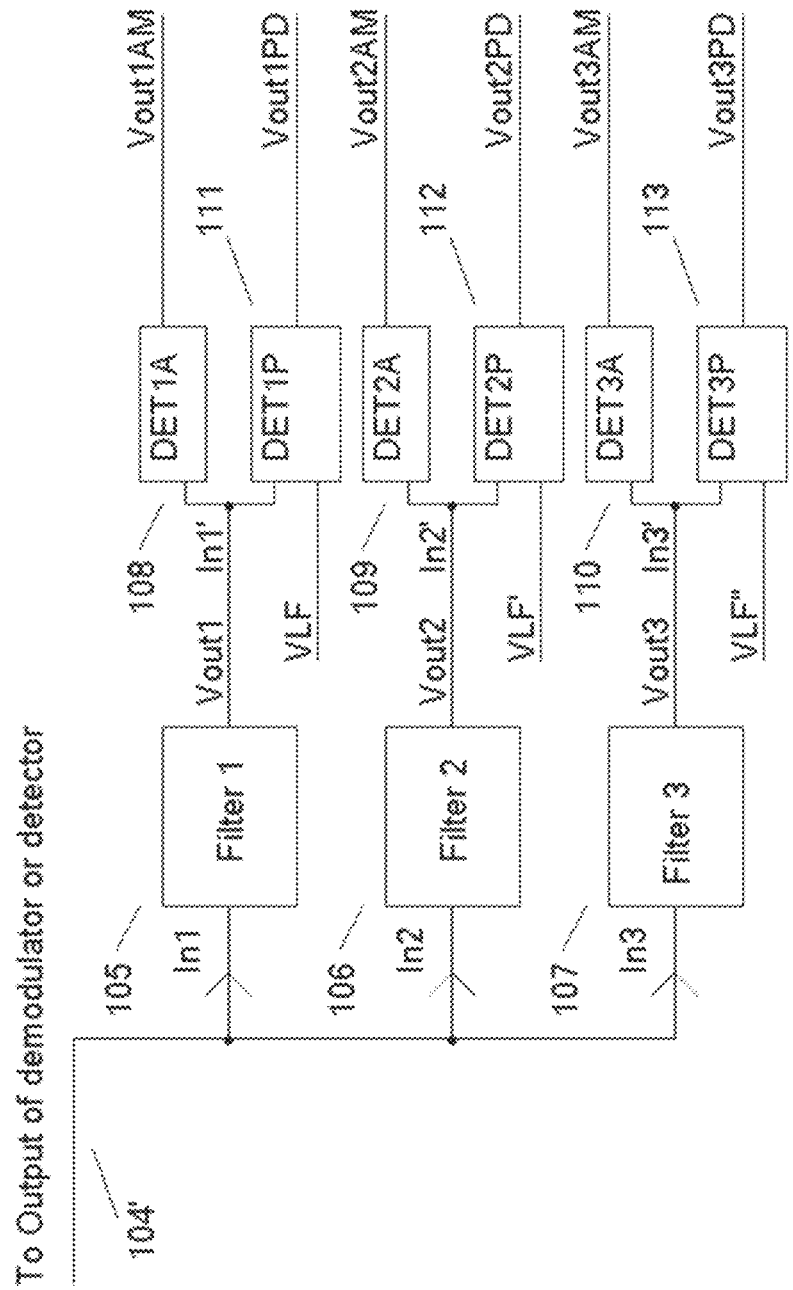

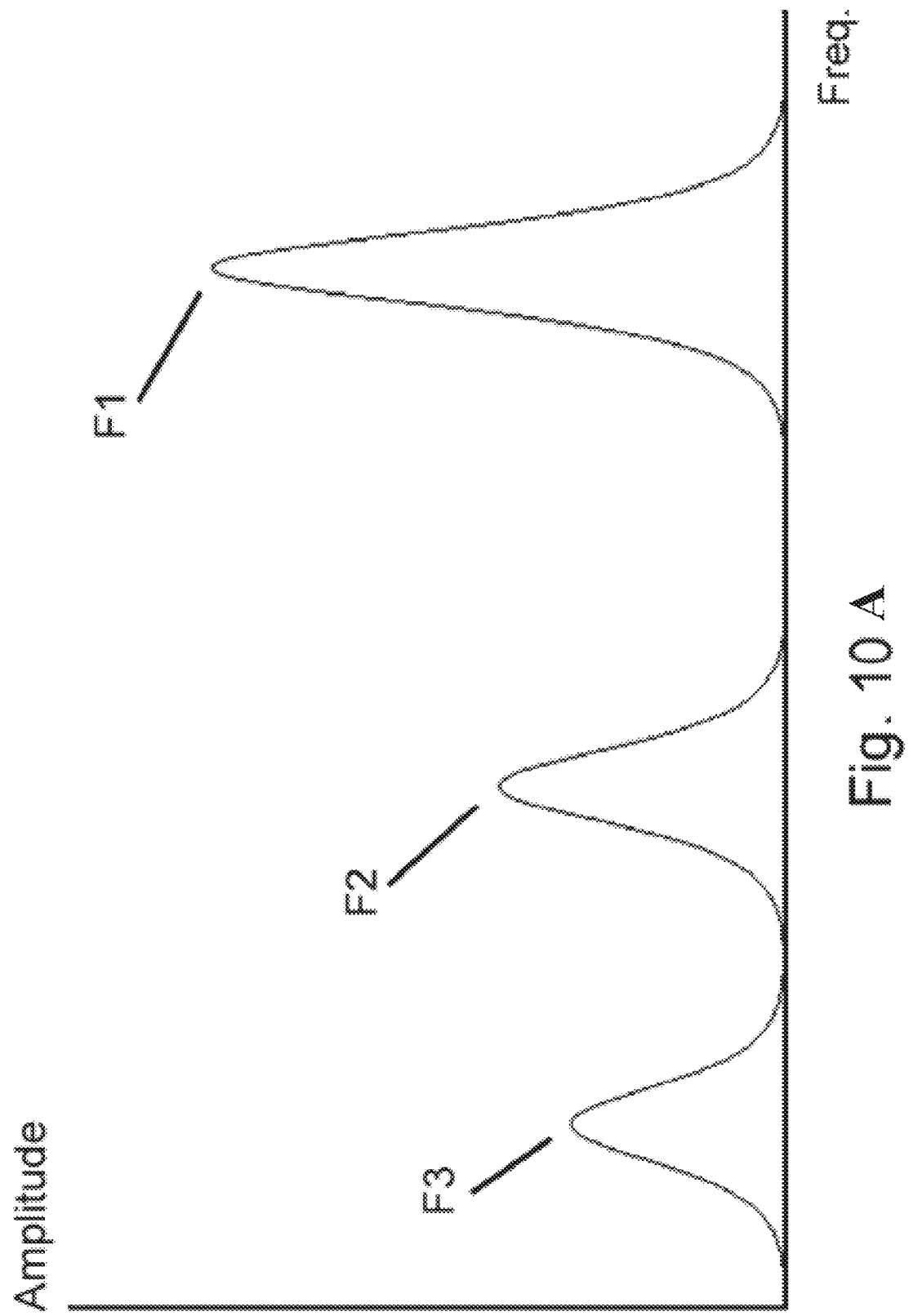

METHOD AND APPARATUS FOR EVALUATING ELECTROSTATIC OR NONLINEAR DEVICES

OVERVIEW

Aspects of various embodiments are directed to evaluating or measuring the position of a Micro-ElectroMechanical System (MEMS) device (e.g., an electrostatic microactuator) in terms of phase and or amplitude characteristics.

MEMS devices are useful for a variety of applications. However, ensuring proper operation of such devices is both important and challenging. For instance, lock-in amplifiers have been used to measure substantially linear displacements of the MEMS device. Various other approaches for assessing MEMS devices have been utilized, yet have been limited in their ability to assess specific components therein.

These and other matters have presented challenges to efficacies and efficiencies of MEMS implementations, for a variety of applications.

SUMMARY

According to certain embodiments, aspects of the present disclosure involve measuring the characteristics of a MEMS device (e.g., an electrostatic microactuator) to provide information related to how the device would behave under certain operating conditions. One example embodiment is directed to examining or measuring each of the MEMS-type elements (e.g., independently) in terms of motion, position, or capacitance. For example, each of the elements (e.g., electrodes) of a MEMS device may be measured independently.

Various example embodiments are directed to issues such as those addressed above and/or others which may become apparent from the following disclosure concerning MEMS devices.

In another specific example embodiment, an apparatus includes a MEMS device as well as filtering and processing circuitry. The MEMS device includes mechanical, electro-mechanical, and a capacitive sections including a first terminal, a second terminal and a common terminal. The terminals are collectively configured to provide electrical-signal stimulation at the first terminal and the second terminal by providing an output signal at the common terminal. The filtering and processing circuitry is configured and arranged to process information derived from the output signal at the common terminal, and generate therefrom a signal indicative of changes in capacitance related to at least one of the first and second terminals of the MEMS device. Such first and second terminals may form part of a capacitor or capacitive structure (element/circuit), and a common terminal may be located sufficiently between the first and second terminals.

A particular embodiment is directed to a MEMS apparatus including a mechanical component configured and arranged to actuate in response to an input signal, and circuitry configured and arranged to actuate the mechanical component by modulating the input signal via signal modulation. The signal modulation may be selected from the group of: drive amplitude modulation, phase modulation, frequency modulation, and a combination thereof. Further circuitry is configured and arranged to determine an angular and linear position of the mechanical component based on the phase of the input signal.

Another embodiment is directed to an apparatus including a MEMS device having mechanical, electro-mechanical, and capacitive portions, and further including a first terminal, a second terminal, and a first common terminal. The apparatus also includes signal sources, including a first signal source configured and arranged to operate at a first frequency and to output a first signal, a second signal source configured and arranged to operate at a second frequency and to output a second signal, wherein the first frequency is lower than the second frequency, a third signal source configured and arranged to operate at a third frequency and to output a third signal, and a fourth signal source configured and arranged to operate at a fourth frequency and to output a fourth signal, wherein the third frequency is lower than the fourth frequency. The apparatus includes further circuitry configured and arranged to combine the first signal with the second signal to form a first combined signal, wherein the first combined signal is coupled to the first terminal of the MEMS device, as well as circuitry configured and arranged to combine the third signal with the fourth signal to form a second combined signal, wherein the second combined signal is coupled to the second terminal of the MEMS device. The first common terminal is configured to produce an output respectively associated with the second and fourth frequencies. The apparatus also includes filtering and processing circuitry configured and arranged to filter and process information derived from the produced output and generate therefrom a signal indicative of changes in capacitance related to the second terminal of the MEMS device.

The above discussion/summary is not intended to describe each embodiment or every implementation of the present disclosure. The figures and detailed description that follow also exemplify various embodiments.

BRIEF DESCRIPTION OF FIGURES

Various example embodiments may be more completely understood in consideration of the following detailed description in connection with the accompanying drawings, in which:

FIG. 6 depicts detection and demodulation circuitry that can be used to recover a signal or signals from the output of amplifier and/or filter circuitry, in accordance with the present disclosure;

FIG. 9 depicts exemplary filter circuitry including measuring circuitry, in accordance with the present disclosure;

FIG. 10A shows a MEMS device including sub-mode(s), or wherein the MEMS device has at least one other frequency of resonance, in accordance with the present disclosure.

Figure 1:
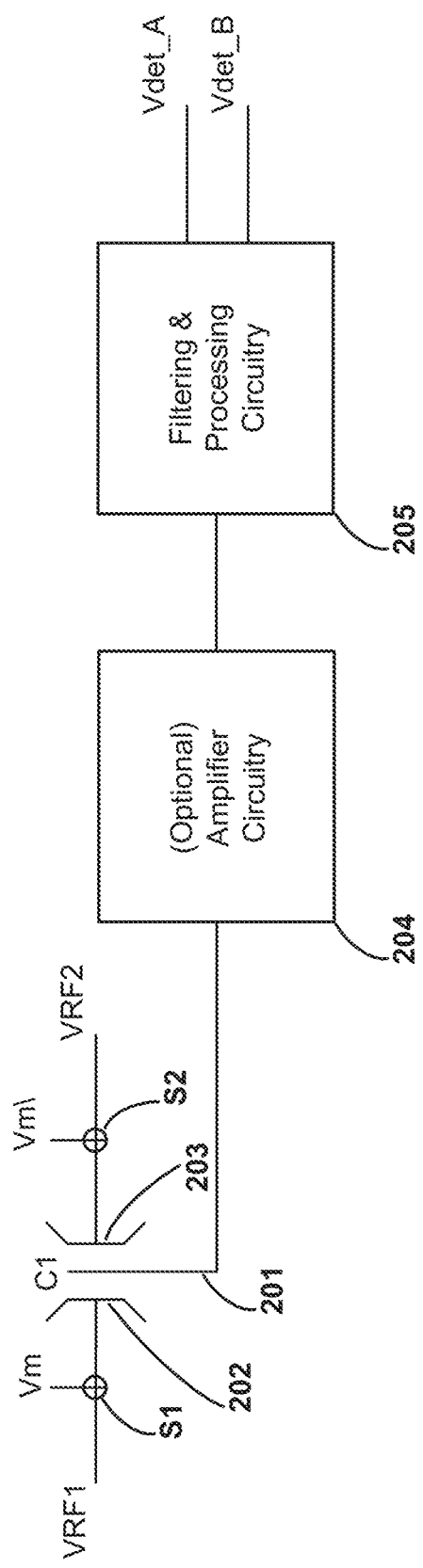
FIG. 1 depicts circuitry including two or more signal sources, in accordance with the present disclosure.

While various embodiments discussed herein are amenable to modifications and alternative forms, aspects thereof have been shown by way of example in the drawings and will be described in detail. It should be understood, however, that the intention is not to limit the disclosure to the particular embodiments described. On the contrary, the intention is to cover all modifications, equivalents, and alternatives falling within the scope of the disclosure including aspects defined in the claims. In addition, the term "example" as used throughout this application is only by way of illustration, and not limitation.

DETAILED DESCRIPTION

Aspects of the present disclosure are believed to be applicable to a variety of different types of apparatuses, systems and methods involving Micro-Electro Mechanical System (MEMS) components. In certain implementations, aspects of the present disclosure have been shown to be beneficial when used in the context of a MEMS device and approach involving measurement and/or utilization of capacitance or motional changes therein. Certain aspects are directed to such implementations using a common signal electrode. In some embodiments, frequency division multiplexing and quadrature signal processing techniques are utilized to facilitate measuring individual portions of a MEMS device. Filter banks may be included to provide real-time analysis of phase and amplitude of fundamental frequency and distortion products. Such approaches may facilitate testing/measuring of individual electrodes within MEMS devices. While not necessarily so limited, various aspects may be appreciated through the following discussion of non-limiting examples which use exemplary contexts.

Accordingly, in the following description various specific details are set forth to describe specific examples presented herein. It should be apparent to one skilled in the art, however, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element. Also, although aspects and features may in some cases be described in individual figures, it will be appreciated that features from one figure or embodiment can be combined with features of another figure or embodiment even though the combination is not explicitly shown or explicitly described as a combination.

Various aspects of the disclosure are directed to an apparatus including a MEMS device as well as filtering and processing circuitry. The MEMS device includes mechanical, electro-mechanical, and a capacitive sections including a first terminal, a second terminal and a common terminal. The terminals are collectively configured to provide electrical-signal stimulation at the first terminal and the second terminal by providing an output signal at the common terminal. The filtering and processing circuitry filters and processes information derived from the output signal at the common terminal, and generates therefrom a signal indicative of changes in capacitance related to at least one of the first and second terminals of the MEMS device.

The output signal at the common terminal can be generated or provided in a variety of manners. In some implementations, the output signal is indicative of a nonlinearity associated with the capacitive section. In other implementations, the output signal is indicative of a nonlinearity associated with the capacitive section, with the MEMS device being configured to respond to changes in amplitudes of or phases associated with the electrical-signal stimulation at the first terminal and the second terminal, and therein to cause accentuation of changes in capacitance as indicated in the generated signal.

In certain embodiments, the MEMS device includes micromirrors coupled to or as part of the MEMS device, wherein resonance associated with the micromirrors or the MEMS device is configured as a function of the output signal. In some implementations, the MEMS device is configured to increase a field of view provided by the micromirrors by at least two orders of magnitude, to facilitate the micromirrors being driven at a selected frequency, and to facilitate drive voltages for the MEMS device to be modulated in amplitude, phase, and/or frequency for optimized scan patterns.

Embodiments involving micromirrors may be utilized in a variety of applications. In some embodiments, micromirrors coupled to or as part of the MEMS device are utilized in an apparatus including or referring to a LIDAR device in which the micromirrors are used in a LIDAR or laser microscopy application. In other embodiments, micromirrors coupled to or as part of a MEMS device and an apparatus that includes or refers to a heads-up or mounted display in which the micromirrors are used for providing images in the heads-up or mounted display.

In accordance with various embodiments, aspects of the present disclosure are directed to a MEMS device including mechanical, electro-mechanical, and capacitive portions, and a first terminal, a second terminal, and a first common terminal. Such first and second terminals may form part of a capacitor or capacitive structure (element/circuit), and a common terminal may be located sufficiently between the first and second terminals. A first signal source can be configured and arranged to operate at a first frequency and to output a first signal. A second signal source can be configured and arranged to operate at a second frequency and to output a second signal. The first frequency is lower than the second frequency. A third signal source can be configured and arranged to operate at a third frequency and to output a third signal. A fourth signal source can be configured and arranged to operate at a fourth frequency and to output a fourth signal. The third frequency is lower than the fourth frequency. Circuitry included in the MEMS device can be configured and arranged to combine the first signal with the second signal to form a first combined signal. The first combined signal is coupled to the first terminal of the MEMS device. The MEMS device may include circuitry configured and arranged to combine the third signal with the fourth signal to form a second combined signal. The second combined signal is coupled to the second terminal of the MEMS device. The first common terminal included in the MEMS device can be configured and arranged to produce an output respectively associated with the second and fourth frequencies. The MEMS device may further include filtering and processing circuitry configured and arranged to filter and process information derived from the produced output, and to generate therefrom a signal indicative of changes in capacitance related to the second terminal of the MEMS device. In some embodiments, the processing circuitry is configured to detect the amplitude and/or phase of a signal being processed.

In accordance with a particular embodiment, an apparatus utilizes modulation of drive amplitude, phase, or/and frequency of a signal applied for actuating a mechanical component, while using a phase monitor to determine the angular and linear position of the mechanical component in real time. In various implementations, the mechanical component includes one or more micromirrors. In a particular such embodiment, micromirrors are used on resonance in a manner that increases their field of view by two orders of magnitude or more, allows the micromirrors to be driven at high frequency to improve the speed of the systems in which they are deployed, and allows the drive voltages to be modulated in amplitude, phase, and frequency for desired scan patterns. These approaches are useful for micromirrors in a variety of applications, such as LIDAR, laser microscopy, and head-mounted displays.

Accordingly, such a micromirror approach may be implemented with the above-mentioned MEMS device including mechanical, electro-mechanical, and capacitive portions, along with the respective terminals. In this context, the mechanical portion includes a micromirror and the circuitry that is configured to detect the phase of the signal being processed is further configured to determine an angular and linear position of the micromirror while the micromirror is driven by a signal exhibiting modulation. Such modulation may include one or more of drive amplitude modulation, phase modulation, frequency modulation, and a combination thereof.

A more particular embodiment is directed to a MEMS apparatus including a mechanical component configured and arranged to actuate in response to an input signal, and circuitry configured and arranged to actuate the mechanical component by modulating the input signal via signal modulation. The signal modulation may be selected from the group of: drive amplitude modulation, phase modulation, frequency modulation, and a combination thereof. Further circuitry is configured and arranged to determine an angular and linear position of the mechanical component based on the phase of the input signal.

Turning now to the figures, it is noted that various common reference numerals are utilized in different figures to refer to different components. In this context, the reference numerals pertain to those components in the figure with which the reference numerals are utilized. While certain such componentry may also be implemented similarly from figure to figure, and while aspects of different figures may be utilized separately or combined, the instant disclosure is not limited as such.

FIG. 1 depicts an example apparatus, in accordance with the present disclosure in which MEMS device C1 includes mechanical, electro-mechanical, and capacitive portions. A first signal source (not shown) can configured and arranged to operate at a first frequency and output a first signal, Vm. A second signal source (not shown) can be configured and arranged to operate at a second frequency and to output a second signal, VRF1. The frequency of the first signal, Vm\, is lower than the frequency of the second signal, VRF1. A third signal source (not shown) can be configured and arranged to operate at a third frequency and to output a third signal, Vm\. A fourth signal source can be configured and arranged to operate at a fourth frequency and to output a fourth signal, VRF2. The frequency of the third signal, Vm\, is lower than the frequency of the fourth signal, VRF2.

Also depicted in FIG. 1 is S1, which is circuitry and/or a function for combining (e.g., an adder) the first signal, Vm, with the second signal, VRF1, to form a first combined signal. The first combined signal is coupled to the first terminal 202 of the MEMS device C1. Similarly, S2 is circuitry and/or a function for combining (e.g., an adder) the third signal, Vm\, with the fourth signal, VRF2 to form a second combined signal. The second combined signal is coupled to the second terminal 203 of the MEMS device C1. First common terminal 201 can be configured between, or sufficiently proximate the adjacent terminals of the capacitor (or capacitive portion of the MEMS device), to produce an output respectively associated with the second frequency, that of the signal VRF1, and the fourth frequency, that of VRF2. Signals Vm and Vm\ can be push/pull, differential, or complementary phase signals whose frequencies can be the same as or different from each other.

Filtering and processing circuitry 205 can be configured and arranged to filter and process information derived from the produced output and generate therefrom a signal indicative of changes in capacitance related to the second terminal 203 of the MEMS device C1. However, if the output signal produced by the first common terminal 201 is a small signal, optionally included amplifier circuitry 204 amplifies the produced output signal before it is further processed by filtering and processing circuitry 205. Filtering and processing circuitry 205 then outputs signals Vdet_A and Vdet_B.

Figure 2:
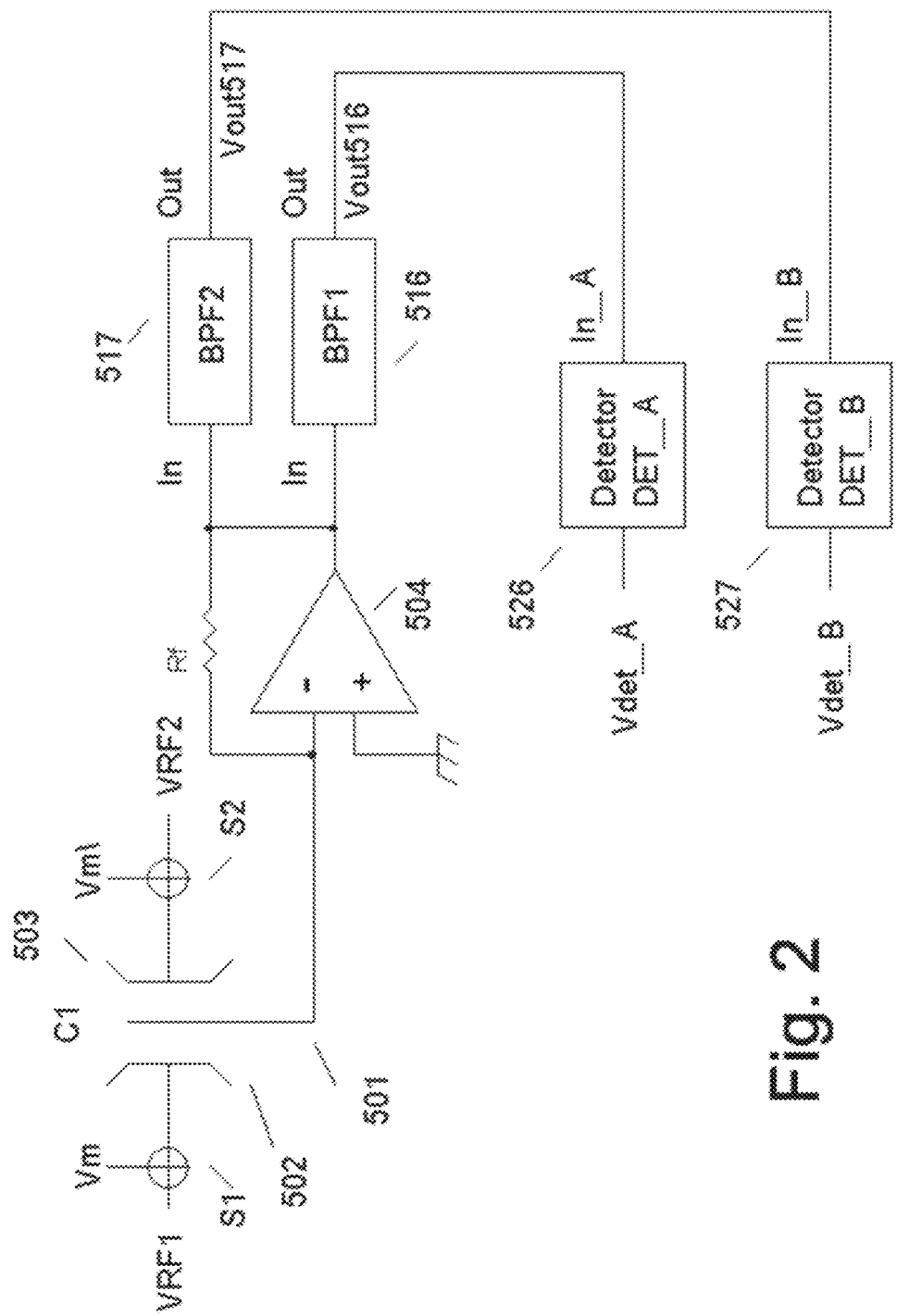
FIG. 2 depicts circuitry including two or more signal sources, in accordance with the present disclosure.

Expounding upon FIG. 1 by using a related but more-specifically characterized block diagram and also to the present disclosure directed, FIG. 2 depicts an embodiment with aspects to a MEMS device receiving first signal Vm, second signal VRF1, third signal Vm\, and fourth signal VRF2. Furthermore, Vm and Vm\ are modulating signals, as they provide deflection and/or rotation within MEMS device C1. Signals Vm and Vm\ can be push/pull, differential, or complementary phase signals whose frequencies can be the same as or different from each other.

In some embodiments, the frequencies of Vm and Vm\ are less than 200 kHz, thus creating movement and/or deflection of MEMS device C1. Frequencies values of VRF1 and VRF2 are typically higher than those of Vm and Vm\. In various related embodiments, carrier frequencies may be in the 1 to 2 MHz range, or could be lower or higher such as 200 kHz to 500 kHz, or 2 MHz to 20 MHz. These and various other related embodiments may be directed toward insuring a low impedance input to negate stay capacitances from wiring, with a carrier frequency of <10% of that (800 MHz or lower). Generally, higher frequencies associated with VRF1 and VRF2 are different from one another, and preclude movement in the MEMS device C1. For instance, if the frequencies of VRF1 and/or VRF2 are ≥1 MHz, VRF1 and/or VRF2 will not be able to cause movement (e.g., vibration, rotation, etc.) in mechanical, electro-mechanical, and/or capacitive elements of the MEMS device C1 because the MEMS device C1 has a mass that cannot respond to a 1 MHz signal, as such a frequency is too high. The frequencies of Vm, Vm\, VRF1, and VRF2 can assume other values, and are not strictly limited to any values or ranges provided herein.

Applying the first combined signal (the result of combining signals Vm and VRF1 at combining circuitry S1) to the first terminal 502 of the MEMS device C1 generates a measurable capacitance across the first terminal 502 and the first common terminal 501. The second terminal 503 of the MEMS device C1 has applied the second combined signal, which is the result of combining signals Vm\ and VRF2 at combining circuitry S2. Application of the second combined signal to the second terminal 503 generates a measurable capacitance across the second terminal 503 and the first common terminal 501. Signals Vm and Vm\ can have the same frequency, and can be used to modulate (e.g., induce mechanical movement in the form of vibration, rotation, etc.) in the MEMS device C1.

The capacitance across first terminal 502 and the first common terminal 501 and/or the capacitance across the second terminal 503 and the first common terminal 501 can be measured independently via amplifier circuitry 504 with bandpass filters 516 and 517. Typically, bandpass filter 516 can be configured and arranged to pass a set of frequencies related to VRF1 while attenuating signals related to VRF2. Additionally and/or alternatively, bandpass filter 517 can be configured and arranged to pass a set of frequencies related to VRF2 while attenuating signals related to VRF1.

Signals output by the bandpass filters 516 and 517 are coupled to detector circuitry (e.g., detectors) 526 and 527. The signals output by detectors 526 and 527 are Vdet_A which provides a signal indicative of the capacitance across the first terminal 502 and the first common terminal 501, and Vdet_B which provides a signal indicative of the capacitance across the second terminal 503 and the first common terminal 501. Signal Vm changes (e.g., modulates) the measurable capacitance of the MEMS device C1 between the first terminal 502 and the first common terminal 501, and signal Vm\ changes (e.g., modulates) the measurable capacitance of the MEMS device C1 between the second terminal 503 and the first common terminal 501. Typically, when signal Vm is combined at combining circuitry S1 with higher frequency VRF1 such that when the capacitance of the MEMS device C1 as measured across the first terminal 502 and the first common terminal 501 is modulated by varying signal Vm, the signal current in the first common terminal 501 is an amplitude modulated signal that is coupled to an input terminal of amplifier circuitry 504. Similarly, when signal Vm\ is combined at combining circuitry S2 with higher frequency VRF2 such that when the capacitance of the MEMS device C1 as measured across the second terminal 503 and the first common terminal 501 is modulated by varying signal Vm\, the signal current in the first common terminal 501 is an amplitude modulated signal that is coupled to an input terminal of amplifier circuitry 504. The signal output by amplifier circuitry 504 includes at least two amplitude modulated signals, typically at different carrier frequencies, such that bandpass filters 516 and 517 pass one carrier frequency and not the other. In some embodiments in accordance with the present disclosure, detectors 526 and 527 can include an amplitude modulation detector and/or amplitude modulation demodulator. Such amplitude modulation detection/demodulation circuitry can include an envelope detector or a synchronous detector.

The bandpass filters 516 and 517 and/or the detectors 526 and 527 depicted in FIG. 2 can include a scaling factor. The scaling factor can be dependent on one or more frequencies of VRF1 and VRF2. If the value of VRF1 is f1 and the frequency of VRF2 is f2, then the scaling factor equals f1/f2 for the bandpass filter 517 or the detector 527. For example, if f1=1 MHz and f2=2 MHz, then the center frequency of the bandpass filter 516 is 1 MHz and the center frequency of the bandpass filter 517 is 2 MHz. Given the same measured capacitance, at 2 MHz the capacitor current in the first common terminal 501 of the MEMS device C1 will be double the capacitor current at 1 MHz. As another example, when the signals Vm and Vm\ are zero, the capacitance measured across the first terminal 502 and the first common terminal 501 equals the capacitance measured across the second terminal 503 and the first common terminal 501. Therefore, applying a scale factor of 50% (1 MHz/2 MHz=0.5, or 50%) to the bandpass filter 517 and/or the detector 527 will reduce the produced output signal by 50%. In turn, this will match the signal gain from the bandpass filter 516 and the detector 526.

Additional embodiments of the present disclosure directed coupling the output terminals and/or signals Vdet_A and Vdet_B of detectors 526 and 527 to a differential amplifier, difference amplifier, transformer, or differencing function to provide a difference signal derived from Vdet_A and Vdet_B. This difference signal provides a signal indicative of a net (combined) movement or position of a rotor or plates of the MEMS device C1 (e.g., an electrostatic microactuator).

Amplifier circuitry 504 can include a transimpedance amplifier and/or a transresistance amplifier including a low impedance/resistance load to the first common terminal 501. Coupling the first common terminal 501 to a low impedance/resistance amplifier can decrease sensitivity to stray (e.g., parasitic) capacitance from wiring resulting in more accurate measurements of the signal current provided by the first common terminal 501.

Figure 3:
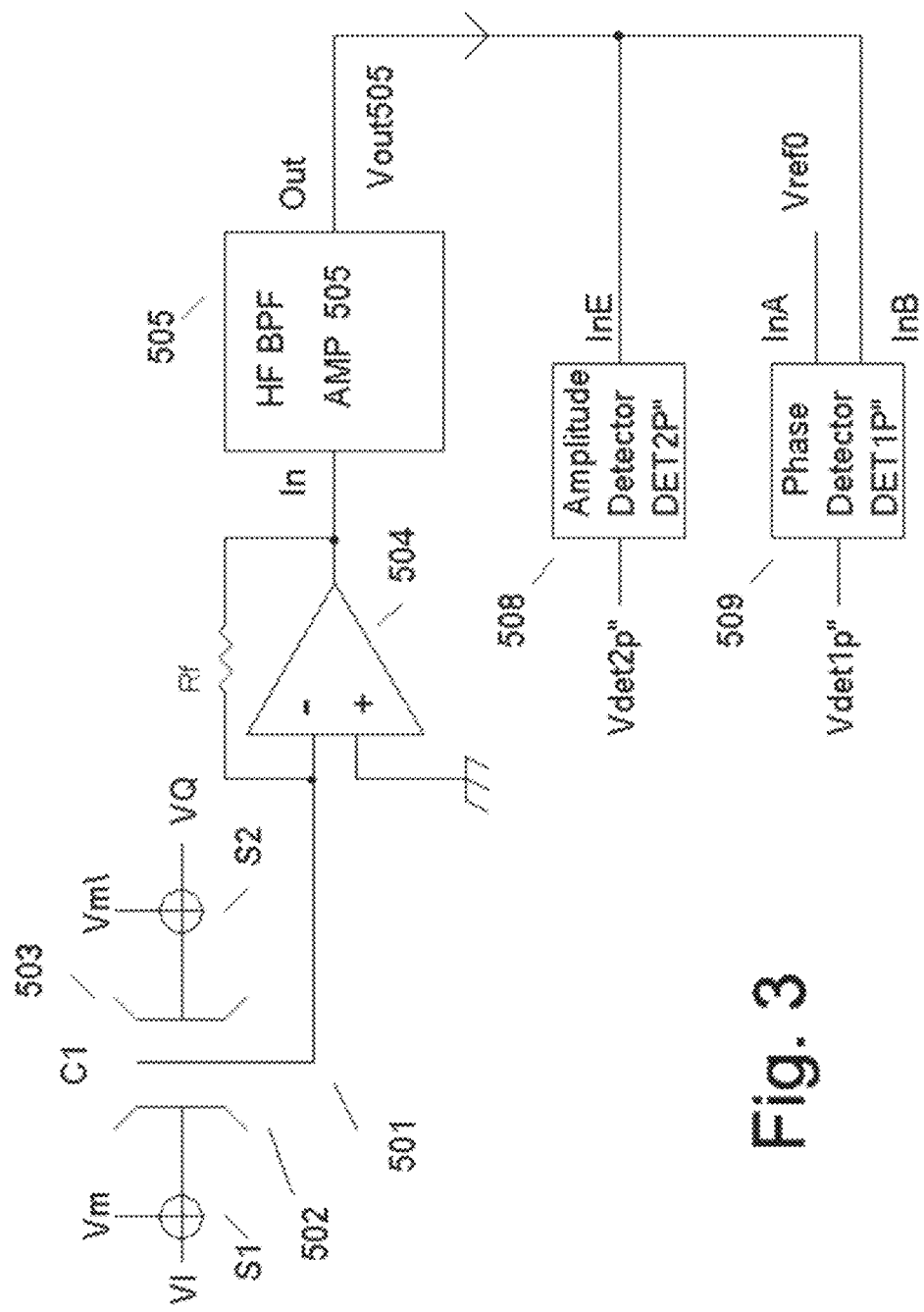
FIG. 3 depicts circuitry utilizing two or more signals with at least two different phases, in accordance with the present disclosure.

Depicted in FIG. 3 is a MEMS device C1 receiving phase-shifted (e.g., quadrature) signals VI and VQ. In various embodiments, the frequency of VI can be equal to the frequency of signal VQ, and the difference in phase between signals VI and VQ can be +/−90 degrees. The frequency of modulating signals Vm and Vm\ is lower than the frequency of VI and VQ, and VI and/or VQ can be one or more carrier signals. Additionally and/or alternatively, VI and/or VQ can be one or more higher frequency signals. For example, VI can include a cosine waveform and VQ can include a sine waveform. The MEMS device (e.g., an electrostatic microactuator) C1 depicted in FIG. 3 can be coupled to lower frequency signals Vm and Vm\. Signals Vm and Vm\ can be push/pull or differential signals. Higher frequency signal VI is combined with Vm at combining circuitry S1. The output of the combining circuitry S1 is coupled to the first terminal 502 of the MEMS device C1. Higher frequency signal VQ is combined with VM\ at combining circuitry S2, the output of which is coupled to the second terminal 503 of the MEMS device C1. The first common terminal 501 is coupled to amplifier circuitry 504, the output of which is coupled to bandpass filter 505. Bandpass filter 505 passes signals related to the frequency of VI and/or VQ, and outputs signal Vout505. The signal output Vout505 by the bandpass filter 505 is input to amplitude detection/demodulation circuitry 508 and phase detection/demodulation circuitry 509. The amplitude detection/demodulation circuitry 508 outputs signal Vdet2p", which is a signal indicative of movement (e.g., the position of) the MEMS device C1. The phase detection/demodulation circuitry 509 includes reference signal Vref0, which includes a signal related to VI and/or VQ that can or cannot be phase shifted. Reference signal Vref0 is coupled to input terminal, InA, of the phase detection/demodulation circuitry 509. The output signal of the bandpass filter 505, Vout505, is coupled to the phase detection/demodulation circuitry 509 at input terminal InB. Signal Vref0 can have a phase such that it provides demodulation of both signals related to VI and VQ. For example, the phase angle of Vref0 can be such that it is an angle halfway between the phase angles of VI and VQ. Output signal Vout505 can include an amplitude modulates signal and/or a phase modulated signal. Amplitude detection/demodulation circuitry 508 outputs signal Vdet2p" which is indicative of motion or the position of a portion of the MEMS device C1. Phase detection/demodulation circuitry 509 outputs a signal, Vdet1p", which is indicative of motion or the position of a portion of the MEMS device C1.

Figure 4:
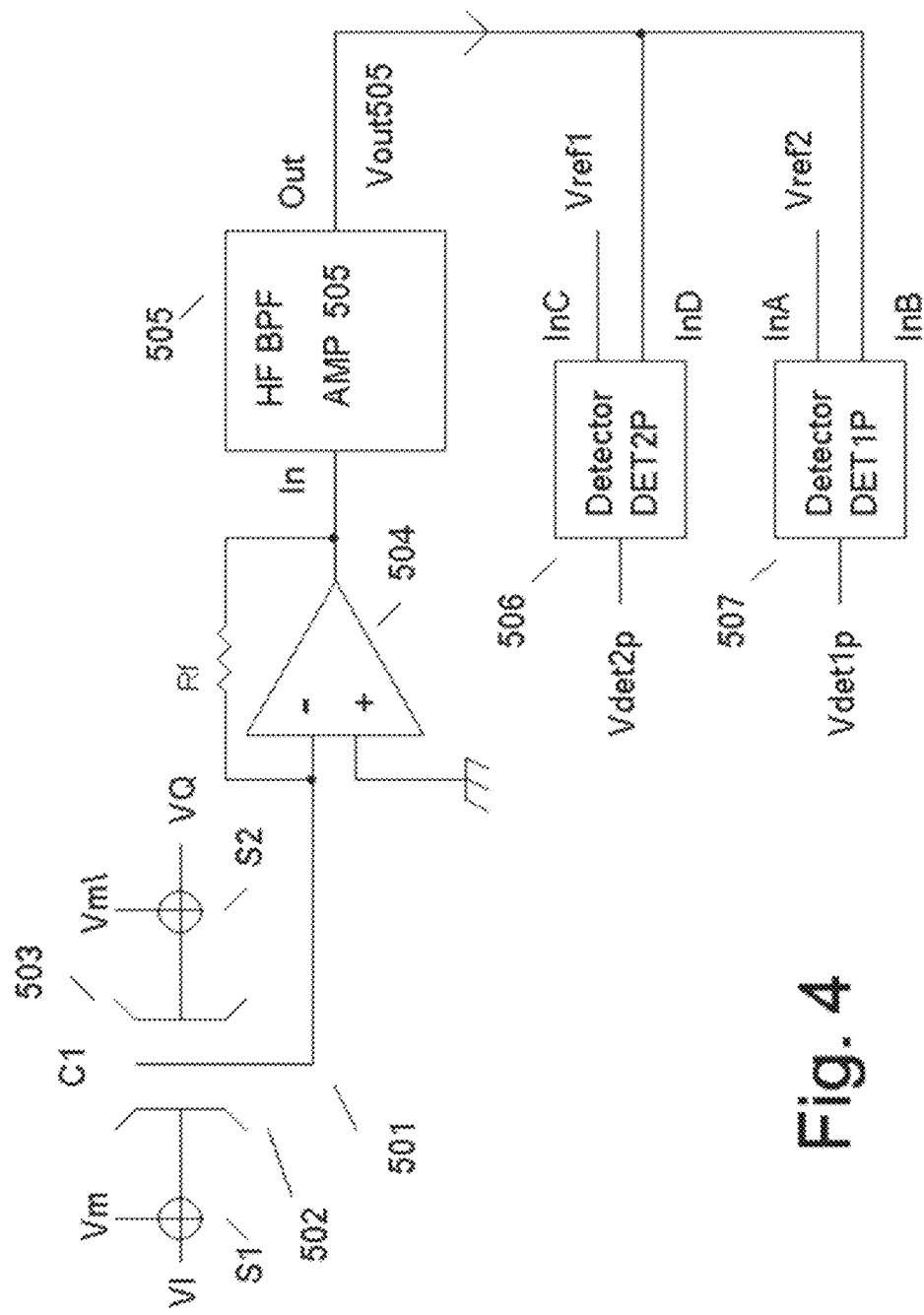
FIG. 4 depicts circuitry using two or more signals with at least two different phases, in accordance with the present disclosure.

FIG. 4 depicts quadrature signals (signals having a phase difference of +/−90 degrees) VI and VQ, which can be used to measure portions of the MEMS device C1. The signal VI provides an 'in-phase' signal, while the signal VQ provides a 'quadrature' signal. Combining circuitry S1 combines (e.g., adds) signals Vm and VI. The output of the combining circuitry S1 is input to the first terminal 502 of the MEMS device C1. Combining circuitry S2 combines (e.g., adds) signals Vm\ and VQ, and outputs a signal that is coupled to the second terminal 503 of the MEMS device C1. The first common electrode 501 of the MEMS device C1 provides a signal that is input to filter circuitry 504. In specific embodiments, Vm and Vm\ can have the same frequency, as can the signals VI and VQ. In such instances, the frequency of Vm and Vm\ is lower than the frequency of VI and VQ.

A first combined signal at the first common terminal 501 provides a modulated (e.g., in terms of amplitude or phase) signal via modulating signal Vm with an in-phase angle (e.g., 0 [zero] degrees). Additionally and/or alternatively, the first common terminal 501 provides a modulated (e.g., in terms of amplitude or phase) signal via modulating signal Vm\ with a quadrature phase angle (e.g., 90 degrees). Amplifier circuitry 504 outputs an amplified signal that is input to bandpass filter 505. Bandpass filter 505 passes signals according to the frequency of VI and/or VQ. Synchronous detectors 506 and 507 provide demodulation of the signal output by bandpass filter 505, using reference signal Vref1 and Vref2. The frequency of Vref1 is the same as VI. The frequency of Vref2 is the same as VQ. Typically, the frequency of VI is the same as the frequency of VQ. In some embodiments, the phase of Vref1 can be either the same or the inverse of the phase of VI, while the phase of Vref2 can be either the same or the inverse of the phase of VQ. In various embodiments, the signals Vref1 and Vref2 can be in quadrature (e.g., the signals are 90 degrees out of phase).

By providing demodulation of quadrature signals, the synchronous detectors 506 and 507 can measure capacitive changes and/or movements of the MEMS device C1. For instance, the capacitance across the first terminal 502 and the first common terminal 501 of the MEMS device C1 can be measured separately/independently of the capacitance across the second terminal 503 and the first common terminal 501 of the MEMS device C1. The synchronous detectors 506 and 507 can include a low pass filter which attenuates the output signal of the synchronous detectors 506 and 507 according to the frequencies of the signals VI and VQ. For example, synchronous detector 506 outputs signal Vdet2p which is indicative of the capacitance and/or movement measured across the first input terminal 502 and the first common terminal 501 of the MEMS device C1. Additionally and/or alternatively, synchronous detector 507 outputs signal Vdet1p which is indicative of the capacitance and/or movement measured across the second input terminal 503 and the first common terminal 501 of the MEMS device C1.

Synchronous detector 506, as depicted in FIG. 4, can include a first input terminal coupled to the first reference signal, Vref1, related to signal VI. Synchronous detector 506 can further include a second input terminal coupled to an output signal (e.g., Vout505) of bandpass filter 505. Similarly, synchronous detector 507, as depicted in FIG. 4, can include a first input terminal coupled to a first reference signal, Vref2, related to the signal VQ. Synchronous detector 507 can further include a second input terminal coupled to an output signal (e.g., Vout505) of bandpass filter 505. Synchronous detectors 506 and 507 can include circuitry for multiplying (e.g., multiplier circuitry) the signals received as inputs in order to generate their respective output signals (e.g., Vdet2p and Vdet1p, respectively). Additionally and/or alternatively, synchronous detectors 506 and 507 can include phase detection circuitry and/or filter circuitry to provide modulation and/or demodulation (e.g., in terms of amplitude or phase) of the signals being processed by synchronous detectors 506 and 507. Synchronous detectors 506 and 507 can be realized through analog or digital means.

If, for example, Vout505 as depicted in FIG. 4 is an amplitude modulated, quadrature signal, it will have the form of: Vout505=$[1+m_{502}(t)][\cos(\omega_c t)]+[1+m_{503}(t)][\sin(\omega_c t)]$, where $m_{502}$ can be thought of as the movement (e.g., deflection) and/or capacitance measured across the first terminal 502 and the first common terminal 501 of the MEMS device C1 over time, and where $m_{503}$ can be thought of as the movement (e.g., deflection) and/or the capacitance measured across the second terminal 503 and the first common terminal 501 of the MEMS device C1 over time. To demodulate this signal, it can be assumed: Vref1=$\cos(\omega_c t)$ at synchronous detector 506, Vref2=$\sin(\omega_c t)$ at synchronous detector 507.

In various contexts, $\omega_c=2\pi f_c$, where $f_c$ is the carrier frequency, or as in these particular embodiments, $f_c$ is the frequency of VI and/or VQ. Referring to synchronous detector 506, which carries out multiplication for demodulation (e.g., prior to output filtering), Vdet2p=$\cos(\omega_c t)\times$Vout505, whereby an output (e.g., low pass) filter is included to provide a signal related to $m_{502}(t)$ and remove signals related to $f_c$. Referring synchronous detector 507, which carries out multiplication for demodulation, Vdet1p=$\sin(\omega_c t)\times$Vout505 whereby another output (e.g., low pass) filter is included to provide a signal related to $m_{503}(t)$ and remove signals related to $f_c$. There is a 90 degree phase shift between Vref1 and Vref2 (e.g., via cosine and sine functions, $\cos(\omega_c t)$ and $\sin(\omega_c t)$). Synchronous detectors 506 and 507 may include a filtering component such as low pass filtering to remove signals related to $f_c$ (e.g., the frequency of VI and/or VQ). Additionally and/or alternatively, synchronous detectors 506 and 507 can include filtering circuitry/functionality such as to effect high pass filtering in order to remove signals related to 0 Hz or around 0 Hz.

Figure 5:
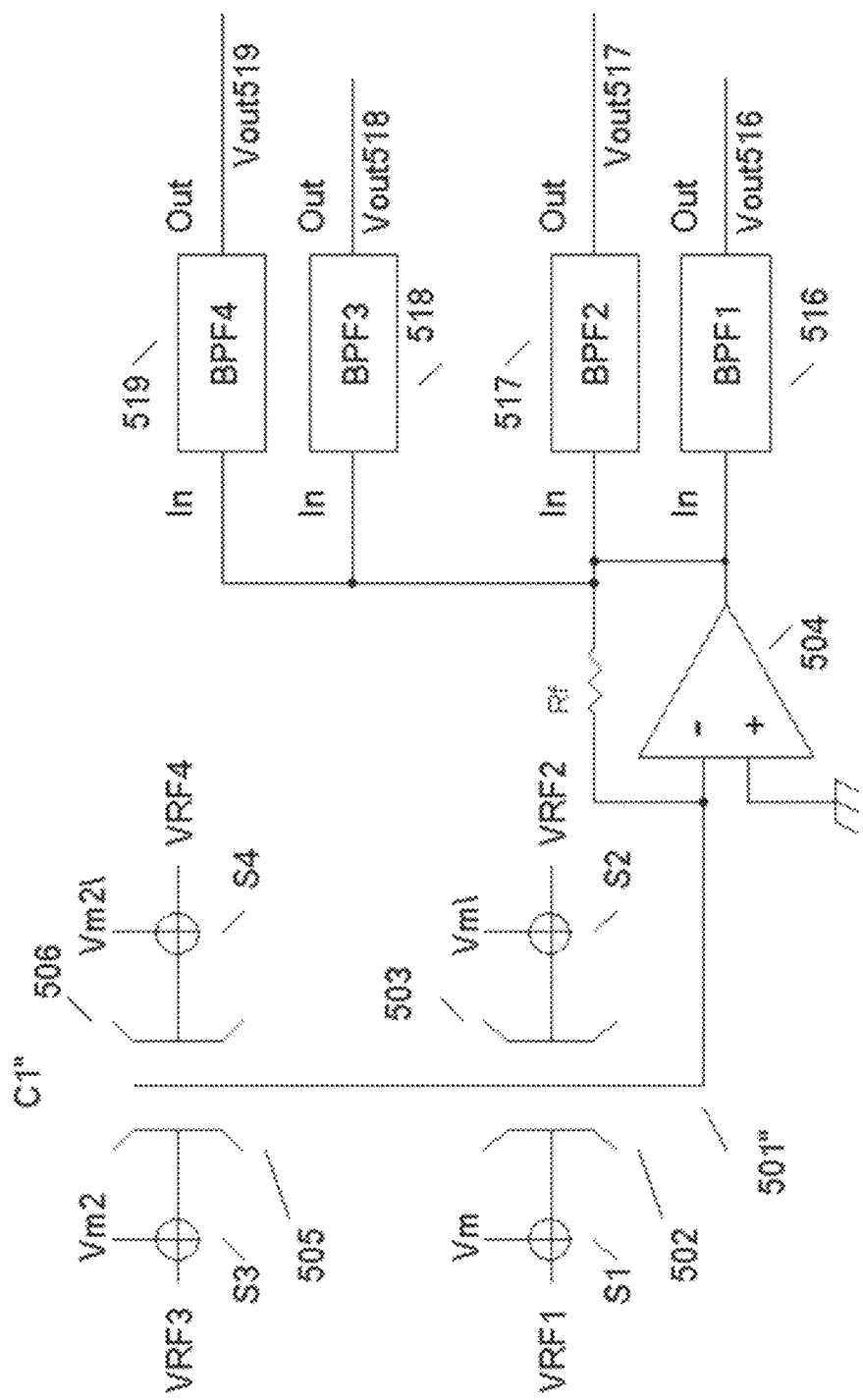
FIG. 5 illustrates an exemplary multi-dimensional device, in accordance with the present disclosure.

FIG. 5 depicts a device including a vertical axis (y-axis) and horizontal axis (x-axis), herein defined as a multi-dimensional device (e.g., the MEMS device C1). Embodiments of the present disclosure are directed to multi-dimensional devices for the projection and/or the display of an image. In specific embodiments, the mechanical, electromechanical, and/or capacitive portions of the multi-dimensional device can be measured separately/independently. For instance, the movement (e.g., displacement) and/or capacitance across the first terminal 502 and the first common terminal 501" of the MEMS device C1" can be measured. Similarly, the movement (e.g., displacement) and/or capacitance across the second terminal 503 and the first common terminal 501" of the MEMS device C1" can be measured. These measurements can be taken independently of one another. The first common terminal of the MEMS device C1" outputs a signal that is input to amplifier circuitry 504.

As a specific example and using FIG. 5 as reference, the (higher) frequencies for the signals VRF1, VRF2, VRF3, and VRF4 may include $\cos(\omega_1 t+\varphi_1)$, $\cos(\omega_2 t+\varphi_2)$, $\cos(\omega_3 t+\varphi_3)$, and $\cos(\omega_4 t+\varphi_4)$, where $\omega_1$, $\omega_2$, $\omega_3$, and $\omega_4$ are frequencies in radians per second and where in general $\omega=2\pi f$, where f=frequency in Hz; and whereby $\varphi_1$, $\varphi_2$, $\varphi_3$, and $\varphi_4$ represent phase shift or phase angle(s). Also, $\omega_1=2\pi f_1$, $\omega_2=2\pi f_2$, $\omega_3=2\pi f_3$, and $\omega_4=2\pi f_4$. For a frequency division multiplex example embodiment, the higher (e.g., carrier) frequencies $f_1$, $f_2$, $f_3$, and $f_4$ are different. Signals Vm and Vm\, used for modulation/deflection, can be push/pull, differential, or complementary signals having the same frequency, a frequency which is less than the value of $f_1$, $f_2$, $f_3$, and $f_4$. Signals Vm2 and Vm2\, used for modulation/deflection, can be push/pull, differential, or complementary signals having the same frequency, a frequency which is less than the value of $f_1$, $f_2$, $f_3$, and $f_4$. In specific embodiments, the signals Vm, Vm2, Vm\, and Vm2\ can have the same frequency, while in other embodiments, the frequency of the signals Vm, Vm2\, Vm, and Vm2\ can be different.

As depicted in FIG. 5, the MEMS device C1" can include a first terminal 502, a second terminal 503, a third terminal 505, a fourth terminal 506, and a first common terminal 501". Combining circuitry S1 combines (e.g., adds) the signal Vm with a higher frequency reference signal, VRF1, and outputs a signal that is coupled to the first terminal 502 of the MEMS device C1". Combining circuitry S2 combines (e.g., adds) the signal Vm\ with a higher frequency reference signal, VRF2, and outputs a signal that is coupled to the second terminal 503 of the MEMS device C1". Combining circuitry S3 combines (e.g., adds) the signal Vm2\ with higher frequency reference signal, VRF3, and outputs a signal that is coupled to the third terminal 505 of the MEMS device C1". Combining circuitry S4 combines (e.g., adds) the signal Vm2\ with a higher frequency reference signal, VRF4, and outputs a signal that is coupled to the fourth terminal 506 of the MEMS device C1". Measuring changes in capacitance in movement and/or capacitance across the first terminal 502, the second terminal 503, the third terminal 505, and/or the fourth terminal 506 and the first common terminal 501, one or more modulated signals (e.g., currents) indicative of the changes in movement/capacitance can be generated. These modulated signals are coupled to amplifier circuitry 504 via the first common terminal 501.

The output of amplifier circuitry 504 is coupled to bandpass filter circuitry 516, 517, 518, 519. The bandpass filter circuitry 516, 517, 518, and 519 pass signals related to the frequencies of the reference signals, VRF1, VRF2, VRF3, and VRF4, respectively. The output, Vout516, of the bandpass filter circuitry 516 can be coupled to a first detection/demodulation circuitry (not shown) for the detection and/or demodulation (e.g., in terms of amplitude or phase) of output signal Vout516. The output, Vout517, of the bandpass filter circuitry 517 can be coupled to a second detection/demodulation circuitry (not shown) for the detection and/or demodulation (e.g., in terms of amplitude or phase) of output signal Vout517. The output, Vout518, of the bandpass filter circuitry 518 can be coupled to a third detection/demodulation circuitry (not shown) for the detection and/or demodulation (e.g., in terms of amplitude or phase) of output signal Vout518. The output, Vout519, of the bandpass filter circuitry 519 can be coupled to a fourth detection/demodulation circuitry (not shown) for the detection and/or demodulation (e.g., in terms of amplitude or phase) of output signal Vout519.

In more-specific embodiments of the present disclosure, FIG. 5 depicts a MEMS mirror projector, including a MEMS device for scanning light into a surface. By evaluating each of the four sections (e.g., measuring independently the movement/capacitance of the first terminal 502, the second terminal 503, the third terminal 505, and the fourth terminal 506 across the first terminal 501 of the MEMS mirror), one or more error correction signals can be combined with the signals Vm, Vm\, Vm2, and Vm2\ at combining circuitry S1, S2, S3, and S4. Two or more of the error correction signals may be similar or dissimilar. The one or more error correction signals can be used to reduce and/or cancel cross-talk between the two scanning axes (e.g., the x-axis and the y-axis) of the MEMS device C1" (e.g., the MEMS mirror projector), thus improving scan linearity along the scanning axes.

The higher frequency (reference) signals VRF1, VRF2, VRF3, and VRF4 can include quadrature signals of the same or different frequencies. For example, VRF1 and VRF2 may be separated in phase by 90 degrees, but can the same or different frequencies. Similarly, VRF2 and VRF3 can be quadrature signals separated in phase by 90 degrees, having the same or different frequencies. As another example, VRF4 and VRF2 can be quadrature signals separated in phase by 90 degrees, having the same or different frequencies. Since the high frequency reference signals VRF1, VRF2, VRF3, and VRF4 are quadrature signals having coupled to them bandpass filter circuitry 516, 517, 518, and 519 and synchronous detectors 506 and 507 (as depicted in FIG. 4), recovery of signal information related to the higher frequency reference signals VRF1, VRF2, VRF3, and VRF4 is possible via modulation with the signals Vm, Vm\, Vm2, and Vm2\.

Bandpass filter circuitry 516-519 depicted in FIG. 5 can be configured and arranged to pass the fundamental frequency and/or various other harmonic frequencies related to the signals Vm or Vm2. For instance, if the frequency of Vm is $f_{mod}$ and the and the frequency of Vm2 is $f_{mod2}$, then the harmonic frequencies of Vm include $n \times f_{mod}$ where n is an integer, and the harmonic frequencies of signal Vm2 include $m \times f_{mod2}$ where m is an integer. In various embodiments, aspects of the present disclosure are directed to determining static or time varying harmonic distortion of the MEMS device C1" by monitoring (e.g., measuring) changes in movement and/or capacitance across at least one of the first terminal 502 and the first common terminal 501", the second terminal 503 and the first common terminal 501", the third terminal 505 and the first common terminal 501", and/or the fourth terminal 506 and the first common terminal 501" of the MEMS device C1".

Depicted in FIG. 6 is detection/demodulation circuitry and/or functions for modulating signals (e.g., in terms of amplitude and/or phase). Input In_A of detection/demodulation circuitry 526, input In_B of detection/demodulation circuitry 527, input In_C of detection/demodulation circuitry 528, and input In_D of detection/demodulation circuitry 529 can be coupled to output filter(s) (not shown). The output signals, Vdet_A, Vdet_B, Vdet_C, and Vdet_D, of detection/demodulation circuitry 526, 527, 528, and 529 can be coupled to, for example, a spectrum analyzer to measure harmonic and/or intermodulation distortion of the signals. The output signals Vdet_A, Vdet_B, Vdet_C, and Vdet_D can be coupled to filter circuitry (not shown) for the purposes of measuring the time varying harmonic and/or intermodulation distortion related to one or more modulation signals (e.g., Vm, Vm\, Vm2, and/or Vm2\ of FIG. 5). Additionally and/or alternatively, the output signals Vdet_A, Vdet_B, Vdet_C, and Vdet_D can be used to evaluate intermodulation distortion that is time varying or that is static. For example, the output signals Vdet_A, Vdet_B, Vdet_C, and Vdet_D can be coupled to filter circuitry to assess the intermodulation distortion at one or more frequencies $p \times f_{mod} \pm q \times f_{mod2}$ wherein p and q are integers. For example a filter bank will pass a signal or signals of at least one frequency of $p \times f_{mod} \pm q \times f_{mod2}$. Phase or phase modulation of an intermodulation distortion signal may be measured via a phase detector/demodulator with a reference phase signal derived from a frequency of $p \times f_{mod} \pm q \times f_{mod2}$.

The detection/demodulation circuitry 526, 527, 528, and 529 depicted in FIG. 6 can recover signals related to the movement and/or capacitance as measured across various portions of a MEMS device, for instance the first terminal 502 and the first common terminal 501 of the MEMS device C1" of FIG. 5. The detection/demodulation circuitry 526, 527, 528, and 529 can include circuitry for the modulation and/or demodulation of signals in terms of amplitude and/or phase. The output signals Vdet_A, Vdet_B, Vdet_C, and Vdet_D can be coupled to amplifier circuitry, the amplifier circuitry can include differential amplifier circuits. For example, supposing a MEMS device including two plates, two stators, and/or two rotors, the output signals Vdet_A and Vdet_B can be coupled to differential amplifier circuitry configured and arranged to perform a subtraction function (e.g., providing a difference signal of Vdet_A–Vdet_B) to generate a net signal for the supposed MEMS device.

Figure 7:
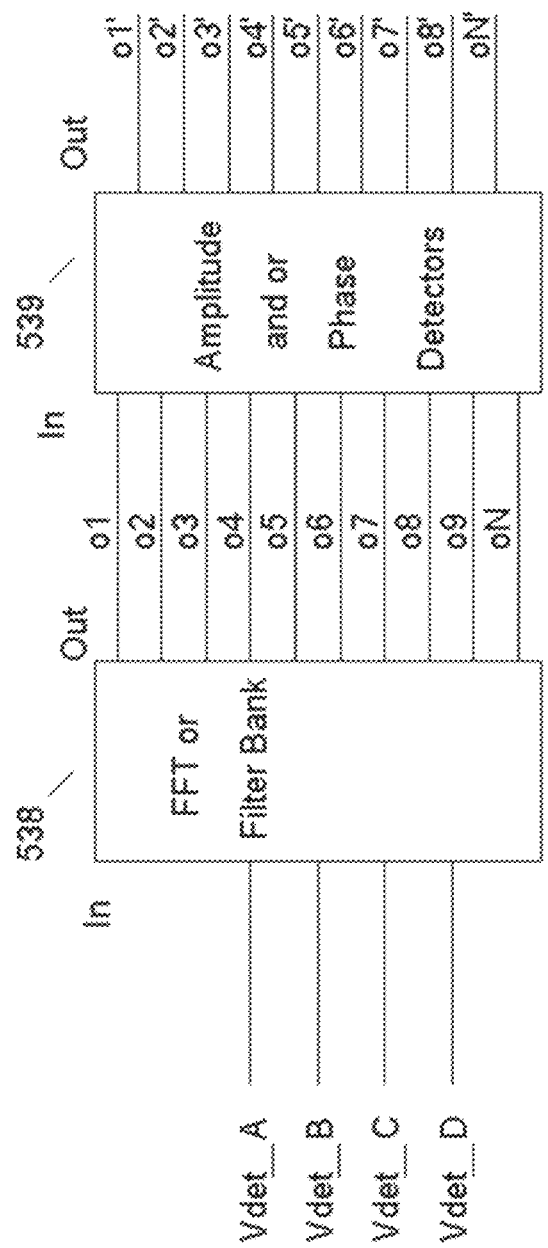
FIG. 7 depicts filter circuitry, in accordance with the present disclosure.

The signals Vdet_A, Vdet_B, Vdet_C, and Vdet_D output by the detection/demodulation circuitry 526, 527, 528, and 529 can undergo a Fast Fourier Transform (FFT), be coupled to a spectrum analyzer, and/or be coupled to filter circuitry 538 as depicted in FIG. 7. The filter circuitry 538 can be configured and arranged to pass a fundamental and/or harmonic frequency of a modulating signal (e.g., Vm, Vm\, Vm2, Vm2\ from FIG. 5). If, for example, the frequency of a first modulating signal is 900 Hz and the frequency of a second modulating signal is 3500 Hz, the filter circuitry 538 can be configured and arranged as bandpass filters having a fundamental frequency of 900 Hz (the frequency of the first modulating signal), a second harmonic at 1800 Hz (twice the frequency of the first modulating signal), 3500 Hz (the frequency of the second modulating signal), and 10,500 Hz (the third harmonic of the second modulating signal). The filter circuitry 538 outputs signals o1, o2, o3 . . . oN, oN representing the Nth bandpass filter circuit included in the filter circuitry 538. Additionally and/or alternatively, oN can represent the Nth bandpass frequency of the filter circuitry 538. One or more signals output by the filter circuitry 538 can display, in real-time and/or near real-time, measurements of the fundamental and/or harmonic frequencies of one or more signals indicative of the movement and/or capacitance of one or more mechanical, electro-mechanical, and/or capacitive portions of a MEMS device (e.g., an electrostatic microactuator). The MEMS device can be a multi-dimensional device (e.g., have at least an x-axis and a y-axis).

Signals output by the filter circuitry 538 can be coupled to circuitry 539 for detecting the amplitude and/or phase of the fundamental and/or harmonic frequencies of these signals. When measuring the phase, reference to one or more input signals (e.g., the signals Vm and/or Vm2 of FIG. 5, or signals related thereto) can be related to a first and/or a second axis of a MEMS device. The fundamental and/or harmonic frequencies of the signals output by the filter circuitry 538.

Figure 8:
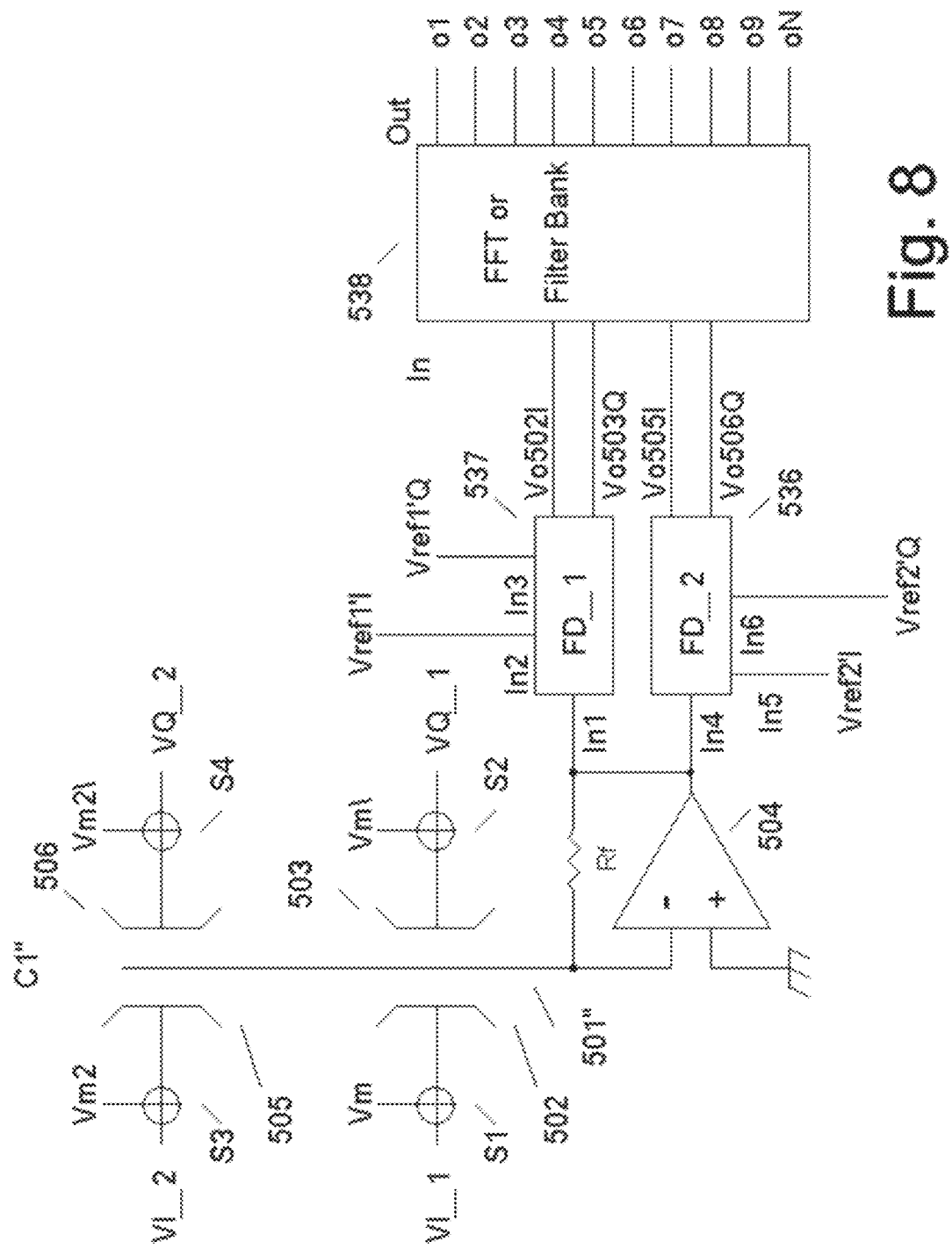
FIG. 8 depicts measurement circuitry including multiple carrier signal sources, in accordance with the present disclosure.

Depicted in FIG. 8 is a multi-dimensional device, C1", receiving as inputs carrier signals VI_1, VQ_1, VI_2, and VQ_2. The signals VI_1 and VQ_1 are in quadrature, as are the signals VI_2 and VQ_2 in quadrature. Also received as input signals are modulating signals Vm, Vm\, Vm2, and Vm2\. The modulating signal Vm is combined with the carrier signal VI_1 at combining circuitry S1, which outputs a signal that is coupled to a first terminal 502 of the MEMS device C1". The modulating signal Vm\ is combined with the carrier signal VQ_1 at combining circuitry S2, which outputs a signal that is coupled to a second terminal 503 of the MEMS device C1". The modulating signal Vm2 is combined with the carrier signal VI_2 at combining circuitry S3, which outputs a signal that is coupled to a third terminal 505 of the MEMS device C1". The modulating signal Vm2\ is combined with the carrier signal VQ_2 at combining circuitry S4, which outputs a signal that is coupled to a fourth terminal 506 of the MEMS device C1". A first common terminal 501 of the MEMS device C1" couples the signals output by the combining circuitry S1, S2, S3, and S4 to amplifier circuitry 504. The frequency of the first carrier signal, VI_1, and the second carrier signal, VQ_1, is the same. The frequency of the third carrier signal, VI_2, and the fourth carrier signal, VQ_2, is the same. The frequency of the first carrier signal, VI_1, and the second carrier signal, VQ_1, is different from the frequency of the third carrier signal, VI_2, and the fourth carrier signal, VQ_2.

Amplifier circuitry 504 can output a signal that is input to a first filtering and detection circuitry 537, having a filter (e.g., a bandpass filter) which passes signals related to the first and/or second carrier signal(s). The first filtering and detection circuitry 537 outputs a signal indicative of the capacitance across the first terminal 502 and the first common terminal 501 and/or a signal indicative of the capacitance across the second terminal 503 and the first common terminal 501 of the MEMS device C1". The first filtering and detection circuitry 537 can include a first demodulation circuit (e.g., circuitry for the detection/demodulation of a signal in terms of amplitude and/or phase) which outputs signals Vo502I and/or Vo503Q. The output signals Vo502I and Vo503Q are indicative of the movement and/or capacitance measured across the first terminal 502 and the first common element 501 and the movement and/or capacitance measured across the second terminal 503 and the first common terminal 501 of the MEMS device C1", respectively. Filtering and detection circuitry 537 can receive one or more reference input signals (e.g., Vref1'I and/or Vref1'Q) for providing synchronous detection and/or demodulation of a modulated signal received at the first terminal 502 and/or the second terminal 503 of the MEMS device C1".

Additionally and/or alternatively, amplifier circuitry 504 can output a signal that is input to a second filtering and detection circuitry 536, having a filter (e.g., a bandpass filter) which passes signals related to the third and/or fourth carrier signal(s). The second filtering and detection circuitry 536 outputs a signal indicative of the capacitance across the third terminal 505 and the first common terminal 501 and/or a signal indicative of the capacitance across the fourth terminal 506 and the first common terminal 501 of the MEMS device C1". The second filtering and detection circuitry 536 can include a second demodulation circuit (e.g., circuitry for the detection/demodulation of a signal in terms of amplitude and/or phase) which outputs signals Vo505I and/or Vo506Q. The output signals Vo505I and Vo506Q are indicative of the movement and/or capacitance measured across the third terminal 505 and the first common element 501 and the movement and/or capacitance measured across the fourth Filtering and detection circuitry 537 can receive one or more reference input signals (e.g., Vref1'I and/or Vref1'Q) for providing synchronous detection and/or demodulation of a modulated signal received at the first terminal 502 and/or the second terminal 503 of the MEMS device C1". Filtering and detection circuitry 536 can receive one or more reference input signals (e.g., Vref2'I and/or Vref2'Q) for providing synchronous detection and/or demodulation of a modulated signal received at the third terminal 505 and/or the fourth terminal 506 of the MEMS device C1".

The signals Vo502I and Vo503Q can be input to a first differential amplifier circuit, which outputs a signal indicative of the combined capacitance, movement, and/or position of the first terminal 502 and the second terminal 503 relative to (e.g., across) the first common terminal 501 of the MEMS device C1". The signals Vo505I and Vo506Q can be input to a second differential amplifier circuitry, which outputs a signal indicative of the combined capacitance, movement, and/or position of the third terminal 505 and the fourth terminal 506 relative to (e.g., across) the first common terminal 501 of the MEMS device C1".

Circuitry 538 can be configured and arranged to perform spectrum analysis, Fast Fourier Transform (FFT), and/or additional filtering operations on the signals output by the filtering and detection circuitry 536 and 537. The circuitry 538 can provide real-time and/or near real-time measurements of fundamental frequency signals, harmonic distortion signals, and/or intermodulation distortion signals. Signals output from the circuitry 538 are, for example, o1, o2, o3, o4, o5, o6, o7, o8, o9, and or oN, wherein oN denotes an Nth output signal from the circuitry 538. In specific embodiments, a combination of signals of the first terminal 502 and the second terminal 503 is provided when for example the phase angle of Vref1'I→45 degrees instead of 0 degrees (wherein the original phase angle of Vref1'I was 0 degrees), and an output signal is provided from Vo502I or Vo503Q. Other phase angles may be used for Vrref1'I. In another embodiment a combination signal of elements 505 and 505 is provided when the phase angle of Vref2'I→45 degrees instead of 0 degrees (wherein the original phase angle of Vref1'I was 0 degrees), and an output signal is provided via Vo505I or Vo506Q. Other phase angles may be used for Vref2'I. Output signals from the first and/or second filtering and detection circuitry 537 and or 536 may be coupled to circuitry 538 a spectrum analyzer, FFT (Fast Fourier Transform), and/or additional filtering circuitry. The additional filtering circuitry included in the circuitry 538 provides instantaneous measurement of fundament frequency signals, harmonic distortion signal(s), and or intermodulation distortion signal(s).

FIG. 9 illustrates exemplary filtering circuitry that can be included in the additional circuitry 538 of FIG. 8. Input line 104' can be used to input the signals output by detection/demodulation circuitry (e.g. the output signals Vdet_A, Vdet_B, Vdet_C, and Vdet_D of detection/demodulation circuitry 526, 527, 528, and 529, respectively of FIG. 6) to filters 105, 106, and 107. While only three additional filtering circuitry are shown, it should be understood that as many as N filters can be included in the additional filtering circuitry, where N is the same integer used to denote an Nth output signal from the circuitry 538 as seen in FIG. 8. Filtering circuitry included in the filters 105, 106, and 107 can include bandpass filter circuitry, and/or other types of circuitry permitting the passage of the fundamental frequency and/or the harmonic frequencies of any modulation or drive signals received as inputs to a MEMS device (e.g., the multi-dimensional MEMS device C1" of FIG. 8), upstream of the filters 105, 106, and 107.

The filters 105, 106, and 107 can pass signal(s) including intermodulation distortion signals, or signals that can be described by an intermodulation signal having a frequency=$n \times f_{mod\_1} \pm m \times f_{mod\_2}$, where n and m are integers, $f_{mod\_1}$ is a drive or modulation frequency of a first axis, and $f_{mod\_2}$ is a drive or modulation frequency of a second axis of a multi-dimensional MEMS device. Furthermore, intermodulation distortion signals have frequencies related to two or more drive signals, the two or more drive signals having different frequencies from one another. Additionally and/or alternatively, the intermodulation distortion signals can have frequencies and/or phases related to two or more drive signals, the drive signals having similar and/or the same frequencies. In instances when the two (or more) drive signals have the same frequency, the intermodulation signals provide distortion signals which are related to the phase/phase angles of the two or more drive signals. Differences in the phase angles generally provide a show rate change in amplitude of the intermodulation distortion signal when the frequencies causing the distortion are the same (e.g., $\cos[\alpha(t)-\beta(t)]$ where $\alpha(t)$ and or $\beta(t)$ are phase angles of one or more drive or modulating signals, and or where $\alpha(t)$ and or $\beta(t)$ may include time dependent (or time independent) phase angle values).

The output signal(s) of filters 105, 106, and 107 can be coupled to circuitry for measuring the amplitude of a signal (e.g., an amplitude detector) and/or circuitry for measuring the phase of a signal (e.g., a phase detector). Such amplitude and/or phase detection circuitry can be used for measuring amplitude/phase modulation, amplitude/phase differences between reference signals (e.g., reference a drive or modulating signal related to a harmonic of an input drive or modulating signal). Amplitude detection circuitry 108, 109, 110 can receive as inputs a signal(s) relating to the fundamental and/or harmonic frequencies of a drive and/or modulating signal output by the filter circuitry 105, 106, 107. For example, filter 105 can pass signal(s) related to the fundamental frequency of a drive signal, filter 106 can pass signal(s) related to the second harmonic of the drive signal, and filter 107 can pass signal(s) related to the Nth harmonic of the drive signal. Information related to amplitude and/or related to the fundamental frequency and/or harmonic frequencies of these signals can be output as signals Vout1AM, Vout2AM, and Vout3AM. Additionally and/or alternatively, phase detection circuitry 111, 112, 113 can receive as inputs the signal(s) output by filters 105, 106, and 107 along with signal(s) VLF, VLF', and VLF", respectively. The signals VLF, VLF', and VLF" are reference signals to the detection circuitry 111, 112, and 113. The reference signal VLF can be a signal related to a drive signal at the fundamental frequency, the reference signal VLF' can be a signal related to a harmonic frequency (e.g., the second harmonic) of a drive frequency, and the reference signal VLF" can be related to a higher harmonic (e.g., the Nth harmonic) of a drive signal. The signals VLF, VLF', and VLF" can be derived from one or more (input) drive signals. Information related to the modulation and/or the phase of a drive signal can be provided by Vout1PD, Vout2PD, and/or Vout3PD.

Various embodiments of the present disclosure are directed to detection/demodulation circuitry 108-113 including circuitry for demodulating signals (e.g., in terms of amplitude and/or phase). For example, a MEMS device connected to an oscillator circuit (not shown) for providing frequency modulation generally has a frequency demodulation circuit coupled to the oscillator circuit. The output of such a frequency demodulation circuit can be, for example, coupled to the input line 104' as depicted in FIG. 9.

In additional embodiments, the phase difference between the signals Vout1 and Vout2, as depicted in FIG. 9, can be measured by recording differences in the fundamental and/or harmonic frequencies of the signals Vout1 and Vout2, once they have passed through the filters 105 and 106, respectively. Additionally and/or alternatively, the signal VLF can be coupled to Vout2 that includes a harmonic frequency signal, which then has one input of detection/demodulation circuitry 111 coupled to Vout1 and the other input of detection/demodulation circuitry 111 coupled to Vout2. The output of detection/demodulation circuitry 111, Vout1PD, is indicative of the phase or phase modulation between a fundamental frequency signal and a harmonic frequency signal (e.g., harmonic distortion signal). Detection/demodulation circuitry 112 can measure phase or phase modulation between two signals of different harmonic distortion (e.g., an Nth harmonic and an Mth harmonic where N is not equal M). For example, VLF' may be coupled to Vout3 such that one input of detection/demodulation circuitry 112 is couple to Vout2 while the input of detection/demodulation circuitry 112 is coupled Vout3 to provide an output signal Vout2PD of detection/demodulation circuitry 112 that provides a signal indicative of phase or phase modulation between two harmonic distortion signals. The two harmonic distortion signals can include harmonic distortion signals from a multi-dimensional MEMS device such as a signal indicative of x-axis harmonic distortion, and a signal indicative of y-axis harmonic distortion. The multi-dimensional MEMS device can further include an Nth harmonic distortion signal for the x-axis and an Mth harmonic distortion signal for the y-axis, where N and M are integers. Detection/demodulation circuitry 108-113 can coupled to the output of a filter (e.g. 105, 106, and/or 107) for measuring the fundamental and/or harmonic frequency from a first axis (e.g., the x-axis) of a multi-dimensional MEMS device, with a phase of a fundamental and/or harmonic frequency related to the second axis (e.g., y-axis) of the multi-dimensional MEMS device.

Figure 10:
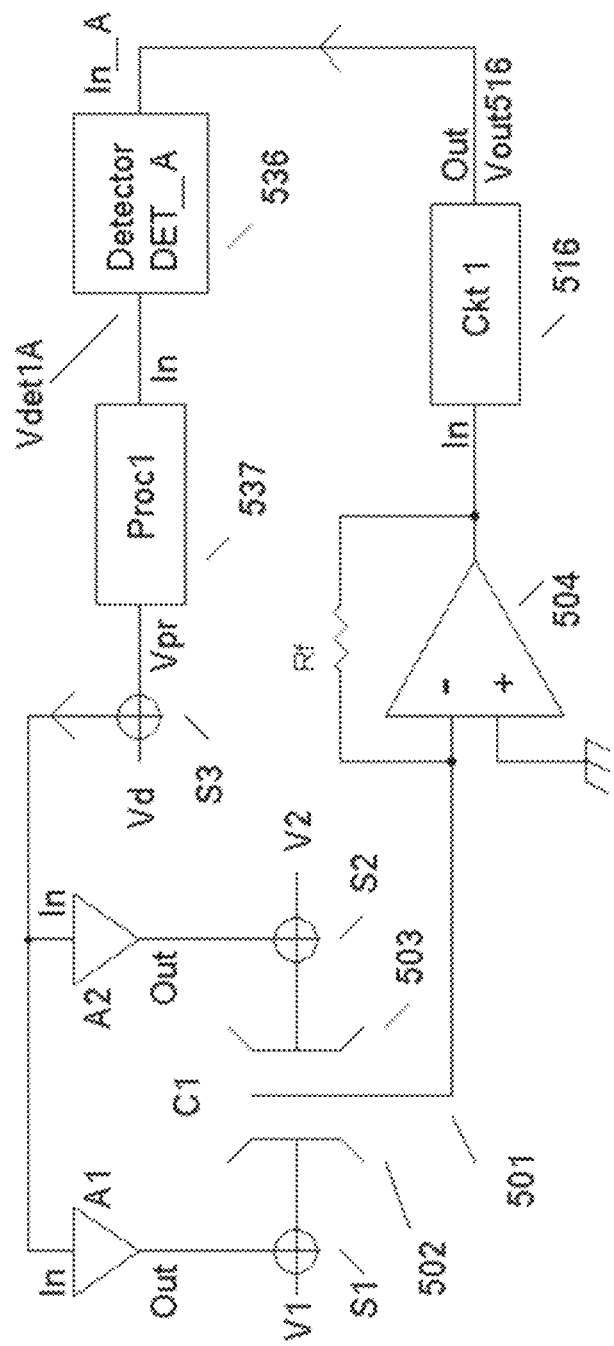
FIG. 10 illustrates a feedback system, in accordance with the present disclosure.

FIG. 10 depicts a multi-dimensional MEMS device C1 configured and arranged in part of a feedback system/loop, in accordance with aspects of the present disclosure. A drive signal, Vd, is input to combining circuitry (e.g., an adder) S3 along with a signal Vpr. The signal resulting from the combination of the drive signal Vd and the signal Vpr at combining circuitry S3 is input to drive amplifiers A1 and A2. The signal Vpr can include an error signal. The drive amplifiers A1 and A2 output push/pull, differential, and/or complementary signals to the combining circuitry S1 and S2, respectively. The combining circuitry S1 combines (e.g., adds) a high frequency carrier signal V1 with the signal output by driver amplifier A1 at the first terminal 502 of MEMS device C1. The combining circuitry S2 combines (e.g., adds) a high frequency carrier signal V2 with the signal output by driver amplifier A2 at the second terminal 503 of the MEMS device C1. The high frequency carrier signals V1 and V2 can include quadrature signal(s) and/or signal components which are +/−90 degrees out of phase. Additionally and/or alternatively, the high frequency carrier signals V1 and V2 can include the same signal(s) and/or (quadrature) signal components.

A first common terminal 501 of the MEMS device C1 can provide a signal as an input to amplifier circuitry 504 which is indicative of the movement and/or capacitance across the first terminal 502 and the first common terminal 501 and/or across the second terminal 503 and the first common terminal 501 of the MEMS device C1. The signal(s) output by amplifier circuitry 504 is input to circuitry 516 for filtering (e.g., providing a bandpass filter function) said signal before outputting signal Vout516 which, in turn, is input to detection/demodulation circuitry 536. The signal Vout516 is a modulated signal (e.g., modulated in terms of amplitude and/or phase). The detection/demodulation circuitry 536 can include circuitry for detecting amplitude modulation of quadrature signals, circuitry for detecting phase modulation of quadrature signals, and/or an envelope detector. Output signal VdetlA from detection/demodulation circuitry 536 is input to processor circuit/function 537 which can include a means of amplifying an input signal (e.g., VdetlA) before outputting a signal (e.g., Vpr) therefrom.

Figure 11:
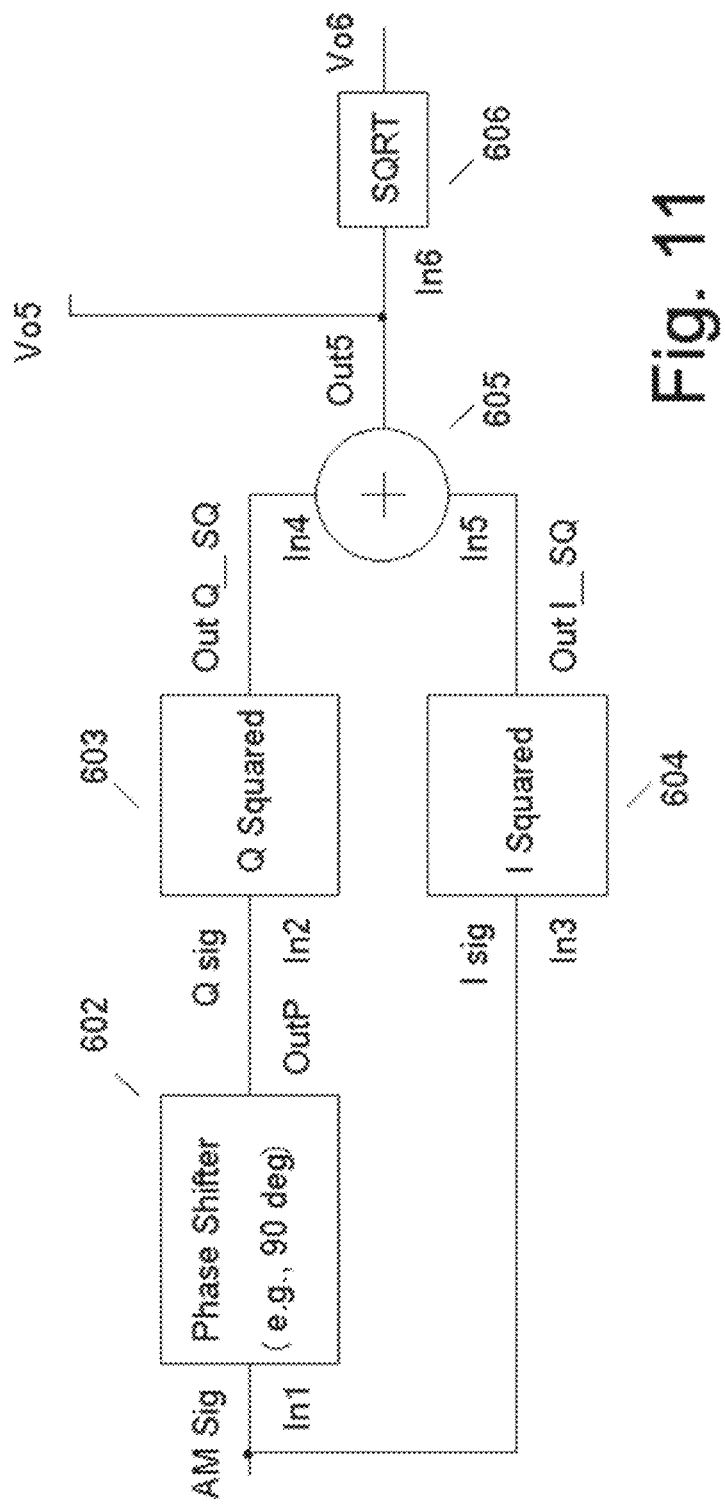
FIG. 11 depicts exemplary quadrature (IQ) modulation and detection circuitry, in accordance with the present disclosure.

Depicted in FIG. 11 is circuitry for the detection/demodulation (e.g., in terms of amplitude and/or phase) of quadrature signals. An amplitude modulation signal, AM Sig is defined as an "I signal" (I sig), that is coupled to an input (e.g., In3) of squaring function, block 604. Another signal, AM Sig, is also coupled to a phase shifter (e.g., via In1), block 602, which provides a 90 degree phase shift to signals around the carrier frequency of the amplitude modulation signal, AM Sig. An output signal, OutP of the phase shifter 602 provides an amplitude modulated signal that includes a quadrature phase carrier signal. For example, the output of the phase shifter transforms AM Sig to a new amplitude modulation signal wherein the carrier signal has been shifted in phase by 90 degrees, which provides a Q signal, Q sig. The phase shifted carrier amplitude modulation signal, Q sig, is coupled to a squaring function/circuitry 603, the output of which is a squared, modulated, quadrature carrier signal OutQ_SQ, which can be described as $(Q\ sig)^2$. The output of squaring function/circuitry 604 provides a squared, in-phase carrier signal OutI_SQ, which can be described as $(I\ sig)^2$. Summing function/circuitry 605 combines/sums OutQ_SQ with OutI_SQ to provide a signal at Out5=(I sig)$^2$+(Q sig)$^2$. For a small modulation index wherein the carrier amplitude changes by a small amount (e.g., <10% or <10% modulation on a carrier signal), the signal from Out5 or Vo5, which is the sum of the squares of I sig and Q sig, or [(I sig)$^2$+(Q sig)$^2$]=Vo5, will provide an AM demodulation signal with sufficiently low (e.g., demodulation) distortion. In some examples, the depth of modulation or modulation index is sufficiently low and the sum of the squares of I sig and Q sig will provide AM demodulation for Detector DET_A block 536 in FIG. 11 (e.g., a feedback system for linearizing position or scanning in a MEMS device). To ensure low distortion demodulation for any amount of modulation index (e.g., including up to 100% modulation), Out5 is coupled to an input of a square root function or circuit, block 606. An output signal, Vo6, from the square root function/circuit 606 then provides demodulation of an amplitude modulation signal. Output signal Vo6 can be characterized as:

$$Vo6 = \sqrt{(I\mathrm{sig})(I\mathrm{sig}) + (Q\mathrm{sig})(Q\mathrm{sig})}.$$

Note in either demodulation signals Vo5 or Vo6, there is no low pass filter required to remove carrier signals because the carrier signals are cancelled via summer/combiner 605 in FIG. 11. The lack of requiring a low pass filter provides an advantage in that the IQ demodulator in FIG. 11 provides minimal phase shift during the demodulation process to recover the modulated signal. Note that the phase shifter 602 is providing a phase shift at the higher carrier frequency. For example, a typical carrier frequency may be in the 1 MHz range, while the (e.g., recovered) modulated signal may have a frequency range from 100 Hz to 10 kHz. Low pass filtering (e.g., using a conventional AM detector such as an envelope detector with a hold capacitor and low pass filter) for a 10 kHz bandwidth provides more phase shift than a phase shifter circuit operating at 1 MHz.

Figure 12:
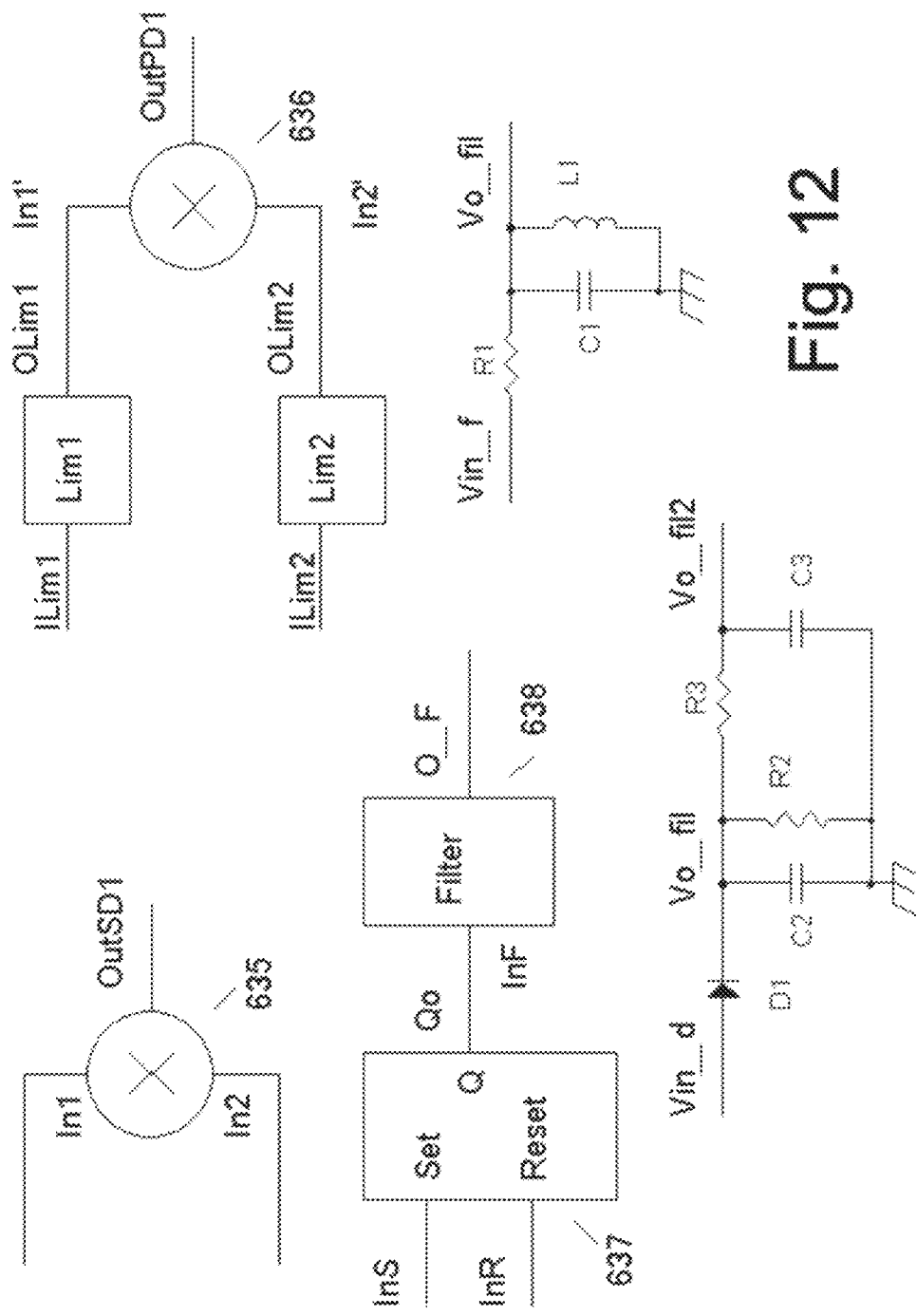
FIG. 12 depicts exemplary demodulation, detection, and filtering circuitry, in accordance with the present disclosure.

FIG. 12 shows examples of detectors, demodulators, and or filters. A synchronous detector or synchronous demodulator is shown via 635, a multiple input multiplier with input terminals In1 and In2. The output of the synchronous detector or multiplier supplies a signal, OutSD1. For example, if a first signal Vin1st is coupled to In1 and a second input signal, Vin2nd is coupled to In2, the output is characterized or described as OutSD1=k×Vin1st×Vin2nd, where k is a constant. A phase detector (e.g., that includes 636, Lim1, and or Lim2) wherein zero crossing of input signals are utilized to measure phase is shown with limiter functions or circuits, Lim1 and Lim2. Input terminals ILim1 and ILim2 are coupled to input signals, wherein a first input signal may be a reference phase signal to be compared with a second input signal for phase measurement. The limiter functions or signals may include a comparator circuit or a mathematical equivalent or similar to a sgn function (e.g., sgn(x)=−1 if x<0, sgn(x)=+1 if x>0). Output signals from the limiters, OLim1 and OLim2 are coupled to inputs of a synchronous detector or to a multiplier, 636. An output signal OutPD1 of 636 provides a phase detector signal, which can be coupled to a low pass filter (e.g., such as a resistor capacitor low pass filter) to remove (e.g., higher frequency) signals related to OLim1 and OLim2; the low pass filter generally has lower frequency signals than those from Lim1 and or Lim2; the low pass filter coupled to OutPD1 provides a signal indicative to a phase difference between the two input signals to ILim1 and ILim2.

In certain implementations, a phase detector circuit includes an exclusive or XOR gate such as a two input XOR gate, and/or a flip flop circuit of function. Block 637 shows an example Set-Reset Flip Flop (e.g., also known as an RS flip flop) included for a phase detector. A first input signal is coupled a Set input terminal, InS, and a second input signal is coupled to a Reset input terminal, InR. Generally the input terminals of flip flop 637 are edge trigged or can be level triggered. Output signal Qo of a Set Reset flip flop goes high when a pulse is transitioned to logic high at the S (set) input, and Qo goes low when a pulse is transitioned from a logic high at the R (reset) input. Flip flop 637 provides an output signal Qo that provides a pulse including a duration dependent on a time (or phase) difference between the two input signals (e.g., first and second input signals). The output signal Qo is coupled to an input terminal, InF, of a Filter (e.g., 638). The output signal, O_F, of Filter 638 removes or attenuates signals related to the input terminals at InS and or InR. An example peak detector or envelope detector for demodulating an AM signal (amplitude modulated signal) is shown via D1, C2, R2, R3 and C3. An AM signal is coupled to input terminal Vin_d, a first terminal of a diode, D1. A second terminal of the diode, D1, is coupled to a peak hold capacitor C2 and to a resistor R2 to discharge capacitor C2. A signal, Vo_fi1, provides a demodulated AM signal with a recovered modulated signal (e.g., lower frequency signals compared to the higher carrier frequency signal of an AM signal). The signal Vo_fi1 includes the recovered modulation signal and also some signals related to the carrier signal of the amplitude modulation signal. A low pass filter provided by R3 and C3 removes or attenuates the carrier signal while passing through the recovered modulated signal. A band pass filter example is provided by R1, L1, and C1. Input to this band pass filter example is provided via Vin_f coupled to a first terminal of R1. A second terminal of R1 is coupled to a first terminal of capacitor C1 and to a first terminal of inductor L1. In this example, the second terminals of C1 and L1 are grounded. The output of the band pass filter is provided via Vo_fi1. The bandwidth of the band pass filter example can be set or varied via values for R1, C1, and or L1. In some implementations, output signal Vo_fi1 is coupled to an input terminal of an amplifier (e.g., buffer amplifier) to avoid loading on the output signal at Vo_fi1. An example high pass filter can be implemented by removing C1, leaving R1 and L1 to provide a high pass filter. A low pass filter may be implemented via removing L1, leaving R1 and C1 as part of this low pass filter.

In one or more embodiments, one or more DC bias voltage(s) may be coupled to one or more elements of a microactuator, MEMS, or electrostatic device as characterized herein.

In another embodiment including a multi-dimensional device (e.g., MEMS device), the resonant frequency of one axis (e.g., X axis) is varied by supplying to another axis (e.g., Y axis) electrode an AC signal of an amplitude and or of a frequency. In one embodiment, the resonant frequency of a first axis is controlled by varying an amplitude level of an AC signal to a second axis. Another embodiment is directed to controlling the resonant frequency of a first axis by varying a frequency of an AC signal to a second axis. A DC voltage may be further combined with the AC signal of the second axis to provide further control of the resonant frequency of the first axis. For example, the AC voltage to the electrode of the second axis can be increased in one or more applications for lowering of the resonant frequency of the first axis. A variable frequency controlled resonator may be implemented using a two (or more) dimensional device (e.g., MEMS or the like) that utilize an X axis electrode (e.g., an X axis resonator) for the resonator and a Y axis electrode for controlling the resonant frequency and or bandwidth (e.g., Q of a resonator) of the X axis resonator. This control may be effected via an AC signal with a particular frequency and or amplitude level supplied to the Y axis. An AC signal may include any combination of: a sine wave, a continuous waveform, a modulated waveform (including amplitude modulation, phase modulation, and or frequency modulation), and or an arbitrary waveform. In a particular embodiment, an AC waveform is supplied to a first axis of a multi-dimensional device to provide a change in effective mass in a second axis of a multi-dimensional device. The effective mass of the second axis is controllable via the amplitude, frequency, and or phase of the AC waveform.

Referring back to FIG. 5, an embodiment may be implemented as follows. A multi-dimensional device, C1", may include elements 502, 503, 505, 506, and 501". Other circuitry such as amplifier 504, Rf, S1, S2, S3, S4, BPF1, BPF2, BPF3, and or BPF4 may be omitted, when controlling a frequency response of one of the axis of C1". In one embodiment, at least two elements of C1" may be utilized for providing a resonant device that is dependent on an AC signal. A driving signal, Vm2 that includes an AC signal is coupled to one of the elements such as 505, which provides a change in frequency response in terms of the elements 502 and or 503, where element 502 and or 503 can be used as a resonant device. For example, a tunable resonant device can be provided by elements 502, 503, and or 501". Tuning for example, is provided by a control signal supplied to element 505 and or 506. The control signal includes an AC signal and or a DC signal. The control signal includes an AC signal with or without a DC bias signal. In an example, the tunable device or frequency dependent device may include elements 502 and 501", or 502 and 503, or 503 and 501", or 502, 503, and 501". Controlling the resonant frequency of C1" or changing the frequency response of C1" (e.g., with elements 502 and 501", or 502 and 503, or 503 and 501", or 502, 503, and 501") is provided by coupling a signal to 505 and or 506. Note that although C1" shows a common terminal or element (e.g., 501") a multi-dimensional device may include one or more common terminals or elements.

In one or more embodiments the resonant frequency or frequency response of a device may be changed via an AC signal, and at least one characteristic of the device may be changed in terms of: a phase response, a frequency response, a sub resonant frequency response, a distortion characteristic including harmonic distortion and or intermodulation distortion. For example, by supplying an AC signal on one axis of the device, can provide a change in distortion characteristic(s) for the other axis of the device.

One or more embodiments may include a portion of the circuits or systems illustrated in the figures. In at least one of the examples such in FIG. 5, the device C1" can be driven with a push pull signal (e.g., Vm and Vm\). In some applications, MEMS or electrostatic devices may be driven using a single-ended approach. One or more embodiments may be applicable to single ended device. For example, in FIG. 5, elements 506 and or 503 may be removed from device C1", which for example will not require Vm1\, VRF4, VRF2, S2 and or S4; in this example elements 502 and or 505 may be driven single ended by Vm and or Vm2.

In one or more embodiments the common element or common electrode (e.g., 501, 501', and or 501") is coupled to an input of an amplifier that provides a virtual AC ground. This virtual AC ground de-sensitizes stray capacitance from wiring or cables.

One or more embodiments may include a feedback system including a microactuator and a quadrature detector comprising: a first higher frequency signal source and a first drive signal source with the microactuator including a first driven terminal and a first common terminal. The first common terminal may be coupled to an input of an amplifier, an output signal may be coupled from the amplifier to an input terminal of a first filter, and an output signal from the first filter may be coupled to an input terminal of the quadrature detector. The output signal from the quadrature detector, first drive signal, and the first higher frequency signal source is coupled to the first driven terminal of the microactuator to provide a feedback system for the microactuator.

Another example embodiment is directed to a system to vary a resonant frequency of a multi-dimension microactuator device. The system includes a multi-dimension microactuator device having a first axis element and a second axis element, as well as a first input terminal for the first axis element and a second input terminal for the second axis element. A first control signal is coupled to the first input terminal. The first control signal includes an alternating current signal and is supplied to the first input terminal to change or vary a resonant frequency of the second axis element of the multi-dimension microactuator device.

Another embodiment may include adding a direct current signal to the first control signal.

In accordance with one or more embodiments, an apparatus and/or method are directed to monitoring the position of an electrostatically driven resonator. Such aspects are directed to and/or may utilize resonant micro-electro-mechanical systems-based (MEMS-based) devices and, in particular applications, to systems for measuring the instantaneous position of an electrostatically driven resonant MEMS-based device. Accordingly, methods and/or apparatuses of the disclosure may relate to evaluating or measuring the position of an electrostatic microactuator (e.g., MEMS device) in terms of phase and or amplitude characteristics. In certain embodiments, distortion characteristics of an electrostatic microactuator are characterized, measured or otherwise utilized to provide increased detail as to how the microactuator is behaving.

Various embodiments are directed to a measurement system that mitigates parasitic capacitance effects referenced to ground, or mitigating the desensitizing of capacitance measurements due to the input capacitance of lock-in amplifiers, such as those mentioned in Jingyan Dong and Placid M. Ferreira, "Simultaneous actuation and displacement sensing for electrostatic drives" 2008 IOP Publishing Ltd. (24 Jan. 2008). Certain embodiments are directed to a capacitance measurement system for MEMS devices that facilitate FM measurement, such as by overcoming drift or offset problems due to inductance and capacitance values changing with temperature, such as may be implemented in connection with one or more aspects of Steven L. Moore and S. O. Reza Moheimani, "Simultaneous Actuation and Sensing for Electrostatic Drives in MEMS using Frequency Modulated Capacitive Sensing," IFAC Proceedings Vol. 47, Issue 3, 2014, pp 6545-=6549 (e.g., with FIG. 3 therein).

Certain embodiments are directed to providing a measurement system that characterizes nonlinearities of the MEMS device while be driven into distortion, or driven into gross distortion that is not characterized accurately by a third order differential equation model such as a Duffing equation. A Duffing or nonlinear equation may be expressed as:

$$\ddot{x}+\delta\dot{x}+kx\pm\beta x^3=\gamma\cos(\omega t)$$

Further embodiments are directed to measuring a MEMS device or system wherein equations that approximates nonlinear behavior, mitigating distortions due to overdriving the MEMS device, addressing such issues with an equation as:

$$\ddot{x}+\delta\dot{x}+kx\pm\beta x^3=\gamma\cos|(\omega t)$$

which may be challenging to predict due to the use of polynomials for modeling the nonlinear behavior of the MEMS device.

Other embodiments are directed to measuring multiple modes of a MEMS device (or a microactuator) wherein two or more different resonant frequencies are identified and characterized in terms of distortion, amplitude, and or phase characteristics. Certain embodiments involve characterizing the nonlinearity of a MEMS (or microactuator) device by using a plurality of filter circuits, amplitude detectors, and or phase detectors to measure the amplitude and phase responses at the fundamental frequency and or measure the amplitude and phase responses at one or more harmonic frequencies. Still other embodiments involve measuring the displacement or deflection of a microactuator (or MEMS device) for an amplitude modulation effect and or a phase modulation effect. The amplitude modulation effect and or phase modulation effect may be measured at a fundamental frequency and or a harmonic frequency of one or more of the following: a dominant mode or normal mode frequency, a sub-mode frequency, and or a spurious mode frequency.

In some embodiments, a measurement system shows dynamic changes (e.g., modulation) or nonlinear effects (e.g., distortion) over the frequency band of the MEMS device. The measurement system includes spectrum analysis of the MEMS capacitance signal when the MEMS device is driven at a frequency near or at its resonant frequency and or when the MEMS device is driven at a mode frequency that is not equal to the dominant resonant frequency. This MEMS capacitance signal may include a distorted waveform such as a parabolic waveform that is indicative of the MEMS capacitance when driven by a sinusoidal waveform. In some experiments, it has been found for example, that a microactuator or MEMS device when coupled to a sinusoidal signal of a fundamental frequency resulted in a distorted or non-sinusoidal displacement or motion. This distorted displacement or motion when decomposed by spectral analysis showed sinusoidal signals at the fundamental frequency and at harmonics of the fundamental frequency, wherein some experiments the amplitude of the harmonic signal was equal or greater than the signal at the fundamental frequency.

Figure 4A:
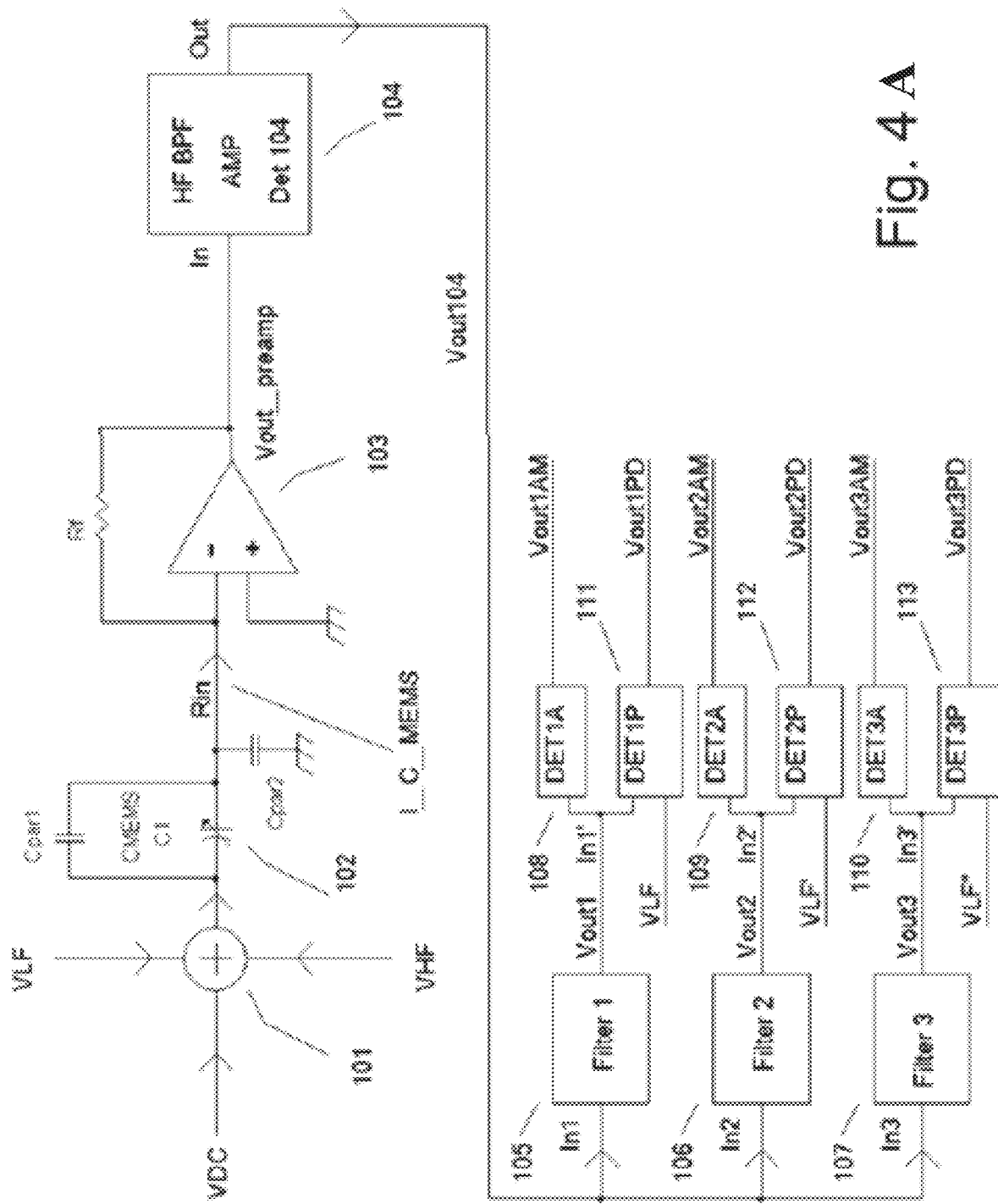
FIG. 4A shows a high frequency signal demodulator that is coupled to multiple filters (e.g., a filter bank) and multiple phase demodulators and multiple amplitude (e.g., AM, amplitude modulation) demodulators, in accordance with the present disclosure.

FIG. 4A shows an embodiment that includes a first detector, 104, to demodulate the modulated high frequency signal and provide a signal, Vout104 that is indicative of capacitance changes of the MEMS device 102, or C1. In FIG. 4A there are shown three input signals, VDC, a DC (direct current) voltage biasing signal to the MEMS device, VLF, a low frequency driving signal that results in displacement or deflection of the MEMS device, and VHF a signal that provides a high frequency signal that is not responsive from the MEMS in terms of displacement or deflection. Note that the DC bias voltage, VDC, coupled to the microactuator or MEMS device may be included or not included. Also, VDC may include a zero voltage or some other DC voltage. Signals VLF, VHF, and VDC provide a low impedance/resistance voltage drive to a first terminal of the MEMS device, C1. This low impedance/resistance voltage drive is essentially not affected by frequency/phase response by the capacitances of the MEMS capacitance, C1, and its parasitic capacitance, Cpar1. By having voltage driven signal into the MEMS device, the changes in MEMS capacitance are accurately reproduced at the output of the trans-resistance amplifier 103. Note that trans-resistance amplifier may be substituted with a common base or common gate amplifier that both have low input resistances. Signal VHF via signal VLF will provide an amplitude modulated capacitor current, I_C_MEMS flowing into a trans-resistance amplifier, 103. The input resistance (e.g., Rin) into the trans-resistance amplifier 103 is a low resistance/impedance compared to the impedance of parasitic capacitance, Cpar2; this results in that Cpar2 have no effect on measuring the capacitor current from the MEMS device because virtually all the MEMS capacitor current flows into the trans-resistance amplifier 103. Put in another way, the voltage at (−) input terminal of amplifier 103 is a virtual short circuit to ground via negative feedback resistor Rf. Therefore, with no voltage across Cpar2, there is no AC current flowing into Cpar2. The output signal from amplifier 103 is coupled to a filter (e.g., a filter or band pass filter within block 104) to remove the signal related to VLF while passing a signal related to VHF. For example, filter-amplifier-detector block 104 may include a high pass filter and or a bandpass filter, an amplifier, and or an AM (amplitude modulation) detector. After the AM detector, Block 104 may also include a low pass filter or band reject filter to remove signal(s) related to VHF. When driving the MEMS devices outside of its linear displacement region, the system shown in FIG. 4A allows for analysis of the signal from 104, which generally includes a distorted waveform to be analyzed in detail. For example, the output signal Vout104 may be coupled to a spectrum analyzer, FFT (Fast Fourier Transform), or other spectrum and or phase analysis system.

The output signal Vout104 may be coupled to another amplitude modulation detector to provide a signal indicative of the amplitude of Vout104 as a function of time that may include showing amplitude modulation effect(s) of Vout104, wherein Vout104 may include a distorted waveform.

In FIG. 4A as an example, the output signal Vout104 is coupled to at least one filter such as Filter 1 that may pass signals related to the frequency of the input signal VLF. Filter 1 may include a low pass filter, high pass filter, and or band pass filter. The output of Filter 1 provides an output signal Vout1, which is coupled to amplitude detector/demodulator, DET1A and or to a first input terminal of phase detector/demodulator DET1P. A second input terminal DET1P is coupled to the input signal VLF. An output signal Vout1AM from DET1A provides a signal indicative of amplitude level which may include time varying amplitude a recovered signal of the (e.g., fundamental) frequency of the input signal VLF. An output signal Vout1PD from DET1P provides a signal indicative of phase modulation or static phase from Filter1 that pertains to the fundamental frequency of VLF in relationship from the input signal VLF. To provide further detail on the MEMS displacement characteristics, another filter, Filter2 is utilized to pass a signal whose frequency is other than the frequency of signal source VLF. For example, Filter2 may pass the second harmonic signal or a signal that is twice the frequency of VLF. Filter2 may include a band-pass filter, high pass filter, and or low pass filter. The output signal Vout2 from Filter2 is coupled to an amplitude detector DET2A and or to a first input terminal phase detector DET1P. A second input terminal of phase detector DET2P is coupled to a signal related to the input signal VLF. For example, as shown in FIG. 4A VLF' that is coupled to the second input terminal of DET2P can be a twice frequency signal or second harmonic of VLF. In one example, a signal generator with a common frequency clock can generator in synchronous multiple output signal wherein a fundamental frequency and at least one harmonic frequency that are synchronized. The output signal Vout2AM for example provides measurement of static or time varying amplitude level of the second harmonic component from Vout104. Similarly Filter3 can pass an Nth harmonic signal from Vout104 that allows for analyzing the Nth harmonic from Vout104 in terms of static or time varying amplitude and or for analyzing the Nth harmonic from Vout104 in terms of static or time varying phase. Vout3 from the output of Filter 3 is coupled to amplitude detector DET3A and or to a first input terminal of phase detector DET3P. A second input terminal of DET3P is coupled to VLF" wherein VLF" is a signal related to VLF. For example, VLF" may include an Nth harmonic signal of VLF.

As an illustrative example for the apparatus in FIG. 4A, a MEMS device with driven with a DC bias voltage, VDC=40 volts DC, and with a low frequency signal VLF=15 sin[(2π900 Hz)t], and VHF=sin[(2π 1000 kHz) t], or put in another way, VLF is a 900 Hz sine wave with 15 volts peak and VHF is a 1000 kHz sine wave at 1 volt peak. Note that other frequencies and or amplitudes for signals VLF and or VHF may be used. Also different DC bias voltages for VDC may be used. The VLF signal modulates the capacitance of C1 at 900 Hz sine wave and provides an amplitude modulated 1000 kHz signal via the capacitor current of C1. This amplitude modulated 1000 kHz is generally at least a slightly distorted modulated waveform because the MEMS device is not displacing linearly, which results in non-linear or distorted capacitor current, I_C_MEMS. The output of preamp 103, Vout_preamp, provides a modulated 1000 kHz signal with one or more modulation frequencies related to VLF or 900 Hz (e.g., 900 Hz, 1800 Hz, 2700 Hz, or N×900 Hz, where N is an integer). The Vout_preamp signal is coupled to a band pass filter in block 104 to pass signals around the frequency of VHF (e.g., pass signals around 1000 kHz). For example, the filter in block 104 may include a band pass filter that passes signals from 980 kHz to 1020 kHz that result in a bandwidth of 40 kHz, and a recovered demodulated bandwidth following the Det 104 is half of 40 kHz, which is 20 kHz. The output signal of the detector, Det 104, Vout104 is then coupled to one or more band pass filter(s) at the fundamental frequency (e.g., 900 Hz) of VLF and or a harmonic of the frequency of VLF (e.g., harmonic includes N×900 Hz such as 1800 Hz or 2700 Hz). For example, Filter 1 or block 105 may include a band pass filter for 900 Hz, Filter 2 or block 105 may include a band pass filter for 1800 Hz, and or Filter 3 may include a band pass filter for 2700 Hz (or another frequency). The bandwidth range of Filter 1, Filter 2, and or Filter 3 may be in the range of 1 Hz to at least 100 Hz, however a different bandwidth range or frequency range can be chosen for any of the filters in block(s) 105, 106, and or 107. The output of block 104 is coupled to the input(s) of filter blocks 105, 106, and or 107. The output of Filter1 is coupled to an input of an amplitude detector DET1A (block 108), and to the output of DET1A provides an output signal Vout1AM that provides a signal indicative of the strength of amplitude (e.g., in the time domain) of the fundamental frequency of VLF via the MEMS displacement characteristic. The output of Filter2 is coupled to an input of an amplitude detector DET2A (block 109), and the output of DET2A provides an output signal Vout2AM that provides a signal indicative of the strength of amplitude (e.g., in the time domain) of the second harmonic frequency of VLF via the MEMS displacement characteristic. Filter3 block 107 may be optional. The output of Filter3 is coupled to an input of an amplitude detector DET3A (block 110), and the output of DET3A provides an output signal Vout3AM that provides a signal indicative of the strength of amplitude (e.g., in the time domain) of the third harmonic frequency of VLF via the MEMS displacement characteristic.

In an example to measure static phase and or time varying phase characteristic of the MEMS device, the output of Filter1 is coupled to a first input terminal of phase detector, DET1P (e.g., block 111) and a second input terminal of phase detector DET1P is coupled to the input signal VLF. An output of phase detector DET1P provides an output signal Vout1PD that is indicative of the phase relationship at the fundamental frequency of which the motion, displacement, or deflection of the MEMS device is being compared with the input signal. To measure the static phase and or time varying phase characteristic of the MEMS device at a harmonic (e.g., 2nd harmonic or Nth harmonic) frequency of input signal VLF, the output of Filter2 is coupled to a first input terminal of phase detector, DET2P (e.g., block 112) and a second input terminal of phase detector DET2P is coupled to the input signal VLF or a signal related to the second harmonic frequency (or Nth harmonic) of VLF, which includes the signal VLF'. An output of phase detector DET2P provides an output signal Vout2PD that is indicative of the phase relationship at the second harmonic frequency or Nth harmonic frequency of which the MEMS device driving or displacing at compared to the input signal VLF or to a signal related to an Nth harmonic of input signal VLF. With an optional Filter3, to measure the static phase and or time varying phase characteristic of the MEMS device at a harmonic (e.g., 3rd harmonic or Nth harmonic) frequency of input signal VLF, the output of Filter3 is coupled to a first input terminal of phase detector, DET3P (e.g., block 113) and a second input terminal of phase detector DET3P is coupled to the input signal VLF or a signal related to the third harmonic frequency (or Nth harmonic) of VLF, which includes the signal VLF". An output of phase detector DET3P provides an output signal Vout3PD that is indicative of the phase relationship at the third harmonic frequency or Nth harmonic frequency of which the MEMS device driving or displacing at compared to the input signal VLF or to a signal related to an Nth harmonic of input signal VLF.

Figure 5A:
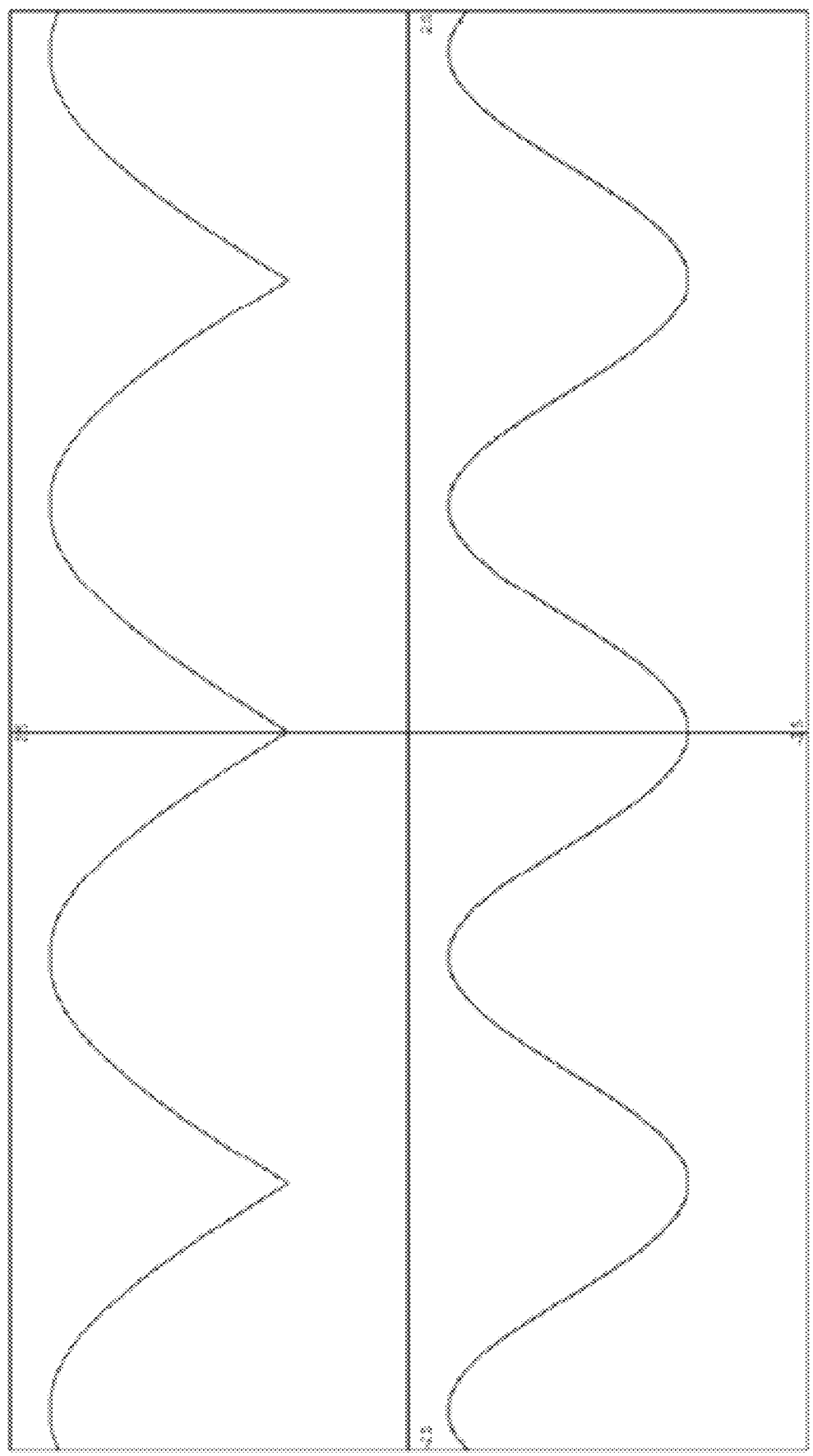
FIG. 5A shows a distorted signal from the output of the HF BPF AMP block 104 from FIG. 4A, in accordance with the present disclosure.

FIG. 5A shows an example top waveform from Vout104 wherein the bottom waveform is an example VLF input signal sinusoidal waveform. The distortion from the top waveform example, which resembles a periodic parabolic signal, includes significant amounts of second and third order distortions (e.g., signals of twice and three times the fundamental frequency of the input signal VLF which is displaced on the bottom trace of FIG. 5A) in other order of >10% second harmonic and or >10% third harmonic distortion. To analyze this distorted waveform example that is indicative of non-linear displacement characteristics of a MEMS device, this distorted waveform may be coupled to a spectrum analyzer or an FFT (Fast Fourier Transform) for measuring the amounts of second, third, and or Nth harmonic distortion signals. The FFT may also include phase information pertaining to the spectral analysis of the fundamental frequency signal, second harmonic signal, and or Nth harmonic signal from the distorted waveform and its input signal (e.g., VLF). The waveform of FIG. 5A may be analyzed in real time as function of time for the amplitude and phase measurements for the spectrally decomposed signal components. For example, in FIG. 4A by using a filter bank that includes one or more band pass filters, the amplitude level (or amplitude modulation) and or phase variation (or phase modulation) of the fundamental frequency and or harmonic distortion signal(s) can be measured as a function of time (e.g., logged or displayed as a time domain waveform).

Figure 6A:
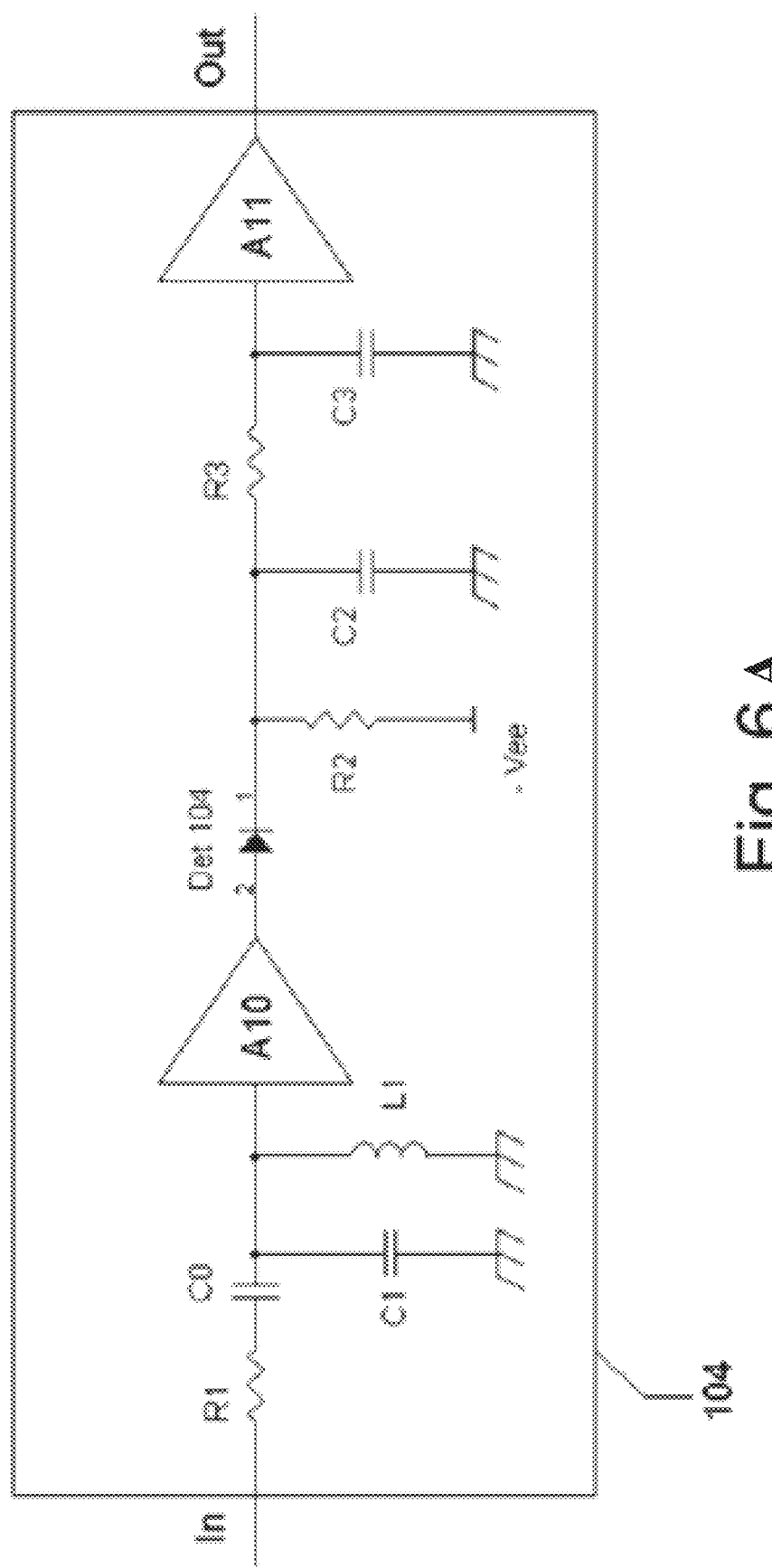
FIG. 6A shows an example circuit of block 104 from FIG. 4A, in accordance with the present disclosure.

FIG. 6A shows an example circuit for block 104 from FIG. 4. Block 104 includes a high frequency band pass filter for pass through signals at frequency of VHF while preferably attenuating signals of other frequencies such as signals related to VLF, the low frequency input signal. The high frequency band pass filter includes a resonant circuit comprising C1 and L1, and the input signal is coupled to this high frequency band pass filter via R1 and CO. Since the input signal to R1 is typically an amplitude modulated signal due to changing capacitances of the MEMS device via input signal VLF, demodulation of the signal from the band pass filter C1 and L1 is done via coupling C1 and L1 to an input terminal of amplifier A10, which isolates C1 and L1 from loading effects of Det104 and R2 that would affect the quality factor or bandwidth of the band pass filter (L1 and C1). The output of A1 then drives the AM (amplitude modulation) detector/demodulator circuit comprising diode or envelope detector Det104 with R2, C2 that forms a peak hold and discharging circuit. The charge capacitor C2 is coupled to an input of an optional low pass filter (e.g., to remove or attenuate signals related to signal VHF, for example a 50 kHz low pass filter) is provided by R3 and C3.

The output of the optional low pass filter at C3 is coupled to amplifier A11 to provide an AM demodulated signal that provides a signal indicative of amplitude variations or displacement variations that may include distortion(s) caused by the MEMS device as a function of time.

Figure 7A:
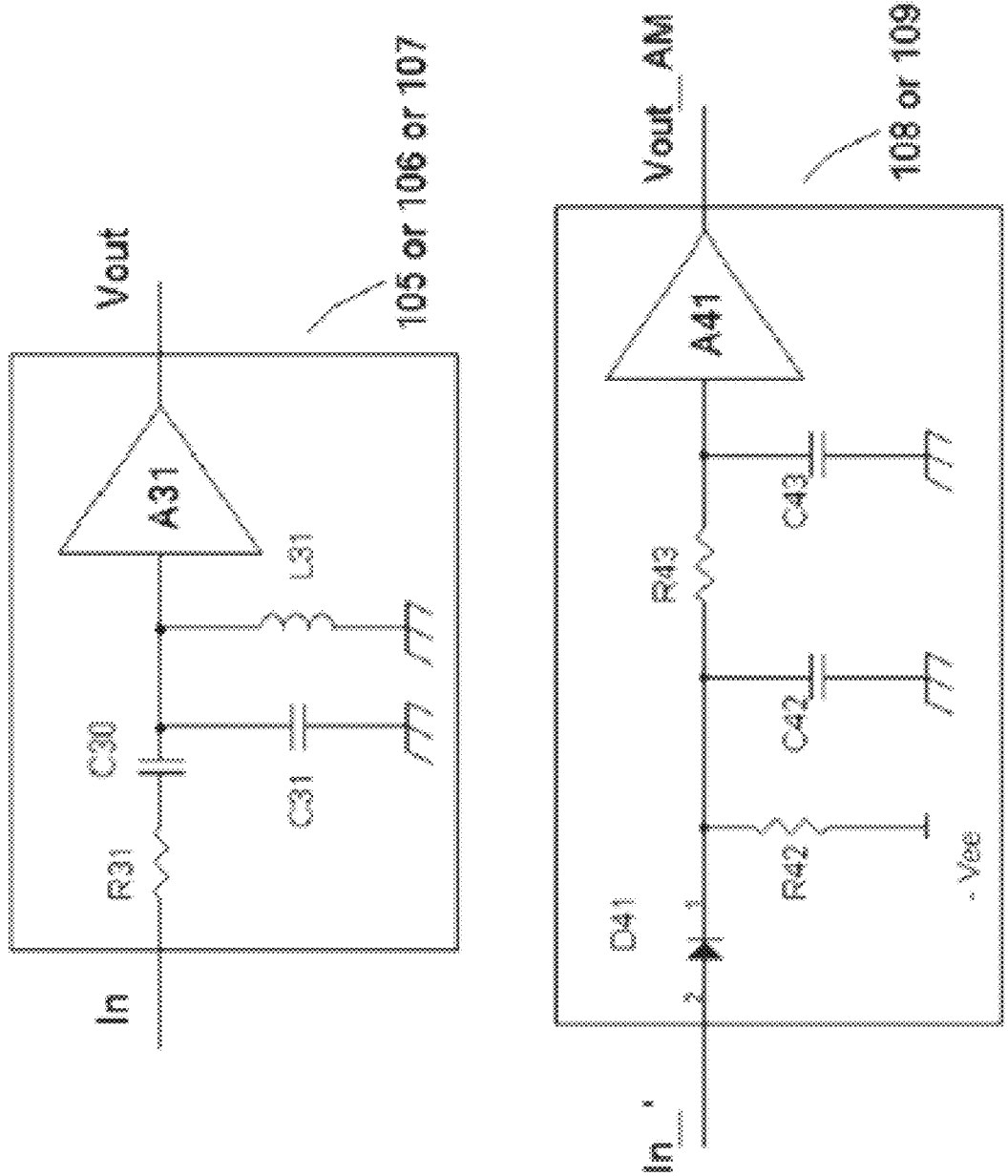
FIG. 7A shows an example filter circuit for blocks 105, 106, and or 107 from FIG. 4A, and an example circuit including a detector/demodulator and filter circuit for blocks 108, 109, and or 110 from FIG. 4A, in accordance with the present disclosure.

FIG. 7A shows a low frequency band pass filter circuit (block 105, 106, and or 107) for example for passing signals at the VLF signal frequency and or a harmonic frequency of the VLF signal. Input resistor R31 is coupled to a band pass filter that comprises C31 and L31 to form a resonant band pass filter. Although the inductor L31 can be a coil for example such as a 0.1 Henry to 1.0 Henry inductor, or L31 can be substituted with a gyrator, active inductor, or simulated inductor circuit including an amplifier and a capacitor. The output of the low frequency band pass filter at L31 and or C31 is coupled to an input of amplifier A31. The output of amplifier A31 provides an output signal. For example, the output signal from amplifier A31 is coupled to an AM detector and or a phase detector.

FIG. 7A also shows an example amplitude detector or amplitude modulation detector whose input signal In_' is provided via the output of a low frequency band pass filter (e.g., via an output signal from A31 or via a signal from the output of block 105, 106, and or 107). A detector diode D41 with R42 and C42 form an envelope detector to provide a signal indicative of the amplitude from one or more of the low frequency band pass filters, block(s) 105, 106, and or 107. An optional low pass filter from the low frequency amplitude detector D41 may be included to attenuate signals whose frequency is related to the input signal VLF. An optional amplifier A41 provides the output signal of the low frequency amplitude detector that includes a DC signal and or an AC signal, wherein the AC signal from Vout_AM is indicative of amplitude fluctuations caused by fluctuations in the displacement of the MEMS device. Fluctuations in the displacement of the MEMS device or a microactuator may include modulating (e.g., amplitude modulation and or phase modulation) one or more signals whose frequency is of a fundamental frequency of the VLF input signal; or fluctuations in the displacement of the MEMS device or a microactuator may include modulating (e.g., amplitude modulation and or phase modulation) one or more signals whose frequency is of a harmonic frequency of the VLF signal.

Figure 8A:
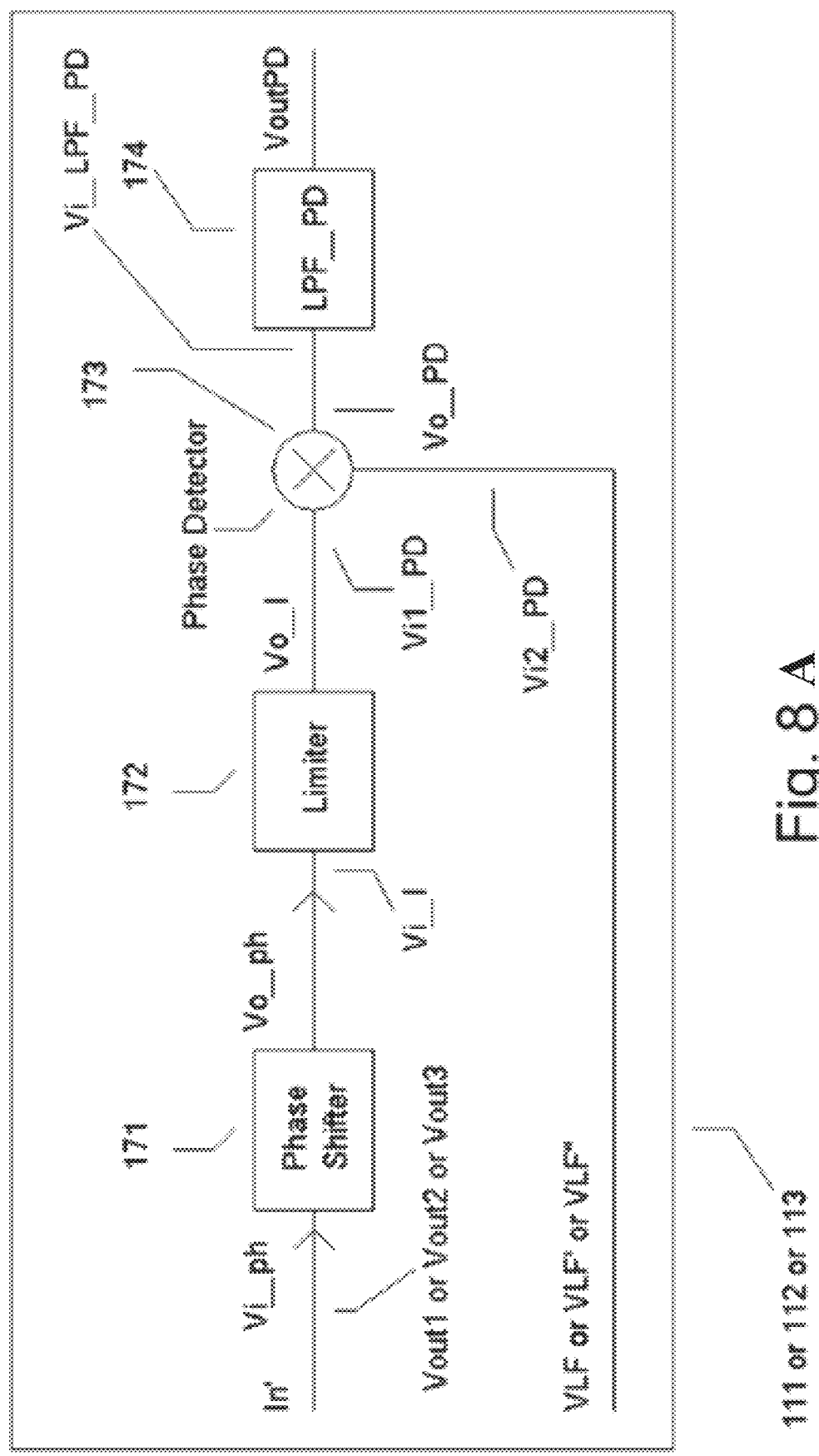
FIG. 8A shows an example phase detector circuit for blocks 111, 112, and or 113 from FIG. 4A, in accordance with the present disclosure.

FIG. 8A shows an example phase detector for blocks 111, 112, and or 113 from FIG. 4A. In FIG. 8A, an input signal, In', such as Vout1 or Vout2 or Vout3 is coupled to an input, Vi_ph, of an optional phase shifter circuit, block 171, whose output signal Vo_ph is coupled to an input terminal, Vi_1, of a limiter circuit that removes or substantially removes amplitude modulation that may be present in the input signal, In'. For a phase detector that includes a multiplier circuit such as block 173, any amplitude variation of a signal into the multiplier circuit or phase detector circuit (e.g., Vi1_PD) will provide erroneous a signal at the output of the multiplier (e.g., Vo_PD). Thus at the output signal, Vo_1l of limiter circuit 172, there is essentially no amplitude variation. An example limiter circuit may include a comparator circuit and or one or more stages of amplification. A reference signal such as the low frequency generator input signal, VLF, VLF', or VLF" as shown in FIG. 4A, is coupled to a second input terminal, Vi2_PD of the phase detector 173. An output signal, Vo_PD, from block 173 phase detector is then coupled to a filter, 174, which removes signals whose frequency is related to VLF. Filter block 174 may include a low pass filter or filter that removes signal components related to the fundamental frequency of VLF and or that removes signal components related to one or more harmonic frequency of VLF. The output signal from the filter 174, VoutPD provides a signal indicative of a phase difference between the input signal VLF and one or more signal(s) from the demodulator/detector block 104. For example, VoutPD provides a phase signal indicative the phase difference between input signal VLF and the fundamental frequency signal related to the displacement of the MEMS device. Alternatively, VoutPD may provide a signal indicative the phase difference between input signal VLF and a harmonic frequency signal related to the displacement of the MEMS device.

For example, FIG. 8A shows an example of a first low frequency phase detector, a second low frequency phase detector, and or an Nth low frequency phase detector.

In FIG. 8A each sub-block such as 171, 172, 173, and or 174 may include respectively a first or Nth phase shifting circuit or phase shifter (171), a first or Nth limiter circuit (172), a first or Nth phase detector circuit, and or a first or Nth phase detector filter.

Alternatively, in FIG. 8A each sub-block such as 171, 172, 173, and or 174 may include respectively a fundamental frequency or Nth harmonic frequency phase shifting circuit or phase shifter (171), a fundamental frequency or Nth harmonic limiter circuit (172), a fundamental frequency or Nth harmonic phase detector circuit, and or fundamental frequency or Nth harmonic phase detector filter.

In another embodiment FIG. 8A shows an example of a fundamental frequency low frequency phase detector, a second harmonic low frequency phase detector, and or an Nth harmonic low frequency phase detector.

Figure 9A:
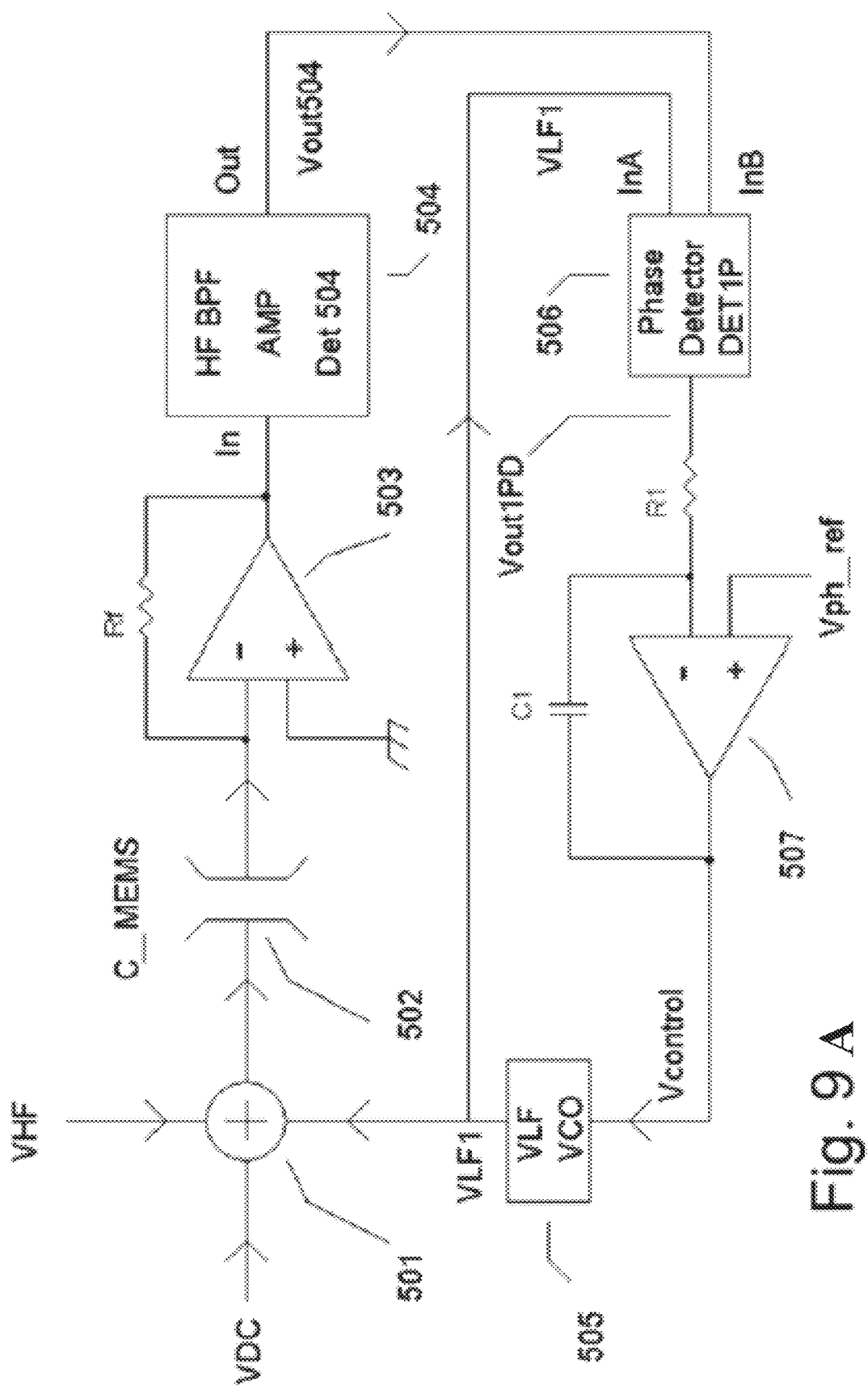
FIG. 9A shows phase detection for providing an accurate method or apparatus to adjust an oscillator to the precise frequency of resonance of a MEMS device, in accordance with the present disclosure.

FIG. 9A shows another embodiment to adjusting the frequency of an oscillator, 505, (e.g., more precisely) including a phase detector, 506. This oscillator in one example is used to drive a MEMS device at resonance, wherein the resonant frequency of the MEMS device (or microactuator) 502, a peak amplitude response is achieved. However, identifying the peak amplitude response of the MEMS device is difficult to identify since even a slightly off resonant frequency will have almost the same peak amplitude when compared to the peak amplitude at the resonant frequency. A phase detector is used to precisely identify the peak resonant response of the MEMS device. Generally, at resonance the MEMS device exhibits a 0 degrees when frequencies below and above the resonance frequency have phase shifts of +90 degrees and −90 degrees. If a MEMS device at resonance has a 90 degrees phase shift, the phase shifts are 0 degrees and −180 degrees for frequencies below and above the resonance frequency. In FIG. 9A, a MEMS device 502 is coupled to a bias DC signal VDC, a low frequency signal VLF1 (e.g., a low frequency sine wave signal), and a high frequency signal VHF via combiner circuit 501. The capacitance current from C_MEMS, 502, is converted to a voltage signal via a first amplifier 503 (e.g., first amplifier 503 may include a trans-resistance amplifier or an amplifier). The output of first amplifier 503 is coupled to an input terminal (e.g., via block 504) of a band pass filter to pass a signal whose frequency is at or near the frequency of signal VHF (e.g., a high frequency signal). An output terminal of the band pass filter is then coupled to an input of a detector or a demodulator (e.g., Det 504 that may include an amplitude modulation (AM) detector such as an envelope detector) to recover a (e.g., low frequency) signal related to the input signal VLF1. An output of the AM detector may be coupled to a detector filter that may include a low pass filter, band pass filter, and or band reject filter. An output signal, Vout504, is provided from the detector and or detector filter.

A first input terminal (e.g., InA of 506) of phase detector 506 is coupled to the output of a voltage controlled oscillator (505) signal VLF1. The output of the voltage controlled oscillator 505 is coupled to a first input terminal of the combiner 501. A second terminal of the phase detector (e.g., InB of 506) is coupled to Vout504, the output of the AM detector or detector filter in block 504. An output signal, Vout1PD from the phase detector 506 is coupled to a second amplifier 507, which may include an amplifier with a low pass filter effect or amplifier 507 with an integrating function (e.g., an integrator amplifier 507 including integrating capacitor C1 and or including input resistor R1). An output of amplifier 507 is coupled to a voltage control input terminal of a voltage controlled oscillator 505 (e.g., voltage controlled oscillator=VCO), which is noted as VLF VCO for block 505. The phase lock feedback system shown in FIG. 9A includes a reference voltage, Vph_ref, coupled to an input of amplifier 507 (e.g., a non inverting input or (+) input of amplifier 507) that results in the phase lock feedback system to vary the frequency of the voltage controlled oscillator 505 until the output voltage, Vout1PD from phase detector 506 matches the reference voltage, Vph_ref. For example, if the phase detector provides 0 volts when the MEMS device is at its resonant frequency, Vph_ref can be set to 0 volts. Or in general if the phase detector provides "X" volts when the MEMS device is at its resonant frequency, Vph_ref can be set to "X" volts.

To determine or identify the peak displacement amplitude response of the MEMS device as a function of the frequency of signal VLF1, the frequency of VLF1 is varied until the peak amplitude response is determined via using a phase detector 506.

In another embodiment by setting the phase reference voltage, Vph_ref, the voltage controlled oscillator can be set to a frequency within the band pass characteristic of the MEMS or microactuator. For example, if the phase characteristic of a MEMS devices is in a range of 0 degrees to 180 degrees with 90 degrees at resonance (e.g., peak amplitude), an as an example the phase detection range relates 0 degrees to a voltage V1 and a voltage of V2 for 90 degrees, and a voltage of V3 for 180 degrees, then Vph_ref can be set to V2+/−ΔV=Vph_ref. For example Vph_ref can be set such that the MEMS device is driven with a frequency that is plus or minus "Y" degrees from the resonant frequency. For example, by setting Vpf_ref to a predetermined value, the MEMS device can be driven at a frequency below or above the resonant frequency (e.g., at either of the −3 dB frequency, or at 45 degrees or 135 degrees where 90 degrees is at resonance). In another embodiment, the reference phase voltage, Vph_ref may be varied or time varying to measure phase and amplitude response of the MEMS via varying the frequency of the voltage controlled oscillator as a function of phase between the low frequency input signal and the phase output response of the MEMS device.

Electromechanical systems can also include a "sub-mode" whereby the electromechanical system resonates at a lower amplitude level (e.g., lower displacement) when compared to its dominant resonant frequency with the largest amplitude (e.g., frequency with the largest amplitude displacement). In FIG. 10 an amplitude versus frequency plot shows an example of a mechanical device or MEMS device that has a dominant resonant frequency at F1; and FIG. 10A shows that there is also at least one sub-mode resonant frequency at F2 and or F3, in which each has a smaller amplitude response that when the MEMS device is operating at F1.

By using a filter or filter bank (e.g., as shown in FIG. 4A), a MEMS or electromechanical device can be analyzed at a "sub-mode" frequency for amplitude and or phase variation/modulation in real time. Thus, one object of the invention is to measure the electromechanical system in terms of amplitude and phase at the sub-mode frequency and or at least one harmonic of the sub-mode frequency. For example the system shown in FIG. 4A may be used to measure an amplitude and or a phase of a MEMS (or microactuator device) at one or more harmonic of a sub-mode frequency via one or more filters or via a filter bank. The amplitude measurement may include a static measurement of amplitude and or may include a dynamic measurement of amplitude (e.g., amplitude modulation measurement of a harmonic signal of a sub-mode frequency; or a static amplitude measurement such as an average over a time period of an amplitude of a harmonic signal of a sub-mode frequency).

Additional aspects of the disclosure are directed to provide measurements as a function of time for the amplitude and phase at one or more sub-mode frequency. For example the system shown in FIG. 4A may be used to measure an amplitude and or a phase of a MEMS (or microactuator device) of a sub-mode frequency via one or more filters or via a filter bank. The amplitude measurement may include a static measurement of amplitude and or may include a dynamic measurement of amplitude (e.g., amplitude modulation measurement of a sub-mode frequency; or a static amplitude measurement such as an average over a time period of an amplitude of a sub-mode frequency).

One embodiment may include a system for measuring dynamic distortion, modulation distortion, modulation in terms of amplitude variation and or phase variation of a MEMS or microactuator with one or more input signals.

For example the MEMS or microactuator may be measured for amplitude modulation and or phase modulation related to displacement or deflection characteristic of the MEMS device or microactuator in a following manner: Coupling a first signal and a second signal to a first terminal of the MEMS device or microactuator to induce deflection or displacement of the MEMS device or microactuator, wherein the frequency of the second signal is higher than the frequency of the first signal; coupling an electrical signal, a MEMS capacitance signal, from the MEMS device or microactuator that is indicative of capacitance of the MEMS device or microactuator; coupling the MEMS capacitance signal to a first demodulator to demodulate the MEMS capacitance signal whose frequency is at a frequency of the frequency of the second signal; providing a demodulated signal from the first demodulator wherein the demodulated signal includes one or more signals with frequency or frequencies related to the first signal that may include frequency or frequencies of the fundamental and or harmonic of the first signal; coupling the demodulated signal from the first demodulator to a spectrum analyzer, to a FFT (Fast Fourier Transform), to an input terminal of a second demodulator, and or to a first input terminal of a third demodulator; wherein the second demodulator includes an amplitude modulation detector and or the third demodulator includes a phase modulation detector; wherein the third demodulator includes a second input terminal that is coupled to the first signal; and wherein the second demodulator provides a demodulated signal indicative of amplitude modulation of displacement or deflection of the MEMS or microactuator, and or wherein the third demodulator provides a demodulated signals indicative of phase modulation of displacement or deflection of the MEMS or microactuator. The first signal and second signal may include a first signal generator and a second signal generator; the first or second signal generator may include a voltage controlled oscillator for providing a frequency modulated signal; the first demodulator may be any combination of an amplitude modulation detector/demodulator, a phase detector/demodulator, or a frequency modulation detector/demodulator. Another embodiment may further comprise a band pass filter coupled between an output terminal first demodulator and an input terminal of the second demodulator wherein the band pass filter pass frequencies related to the fundamental frequency or a harmonic of the first signal.

Various aspects may be implemented using and/or in connection with embodiments disclosed in U.S. Provisional Patent Application Ser. No. 62/627,613, entitled "Signal Driving and Measuring Capacitors and or Nonlinear Elements," to which priority is claimed and which is fully incorporated herein by reference. For instance, various embodiments are directed to a method and/or an apparatus comprising elements in accordance with the Specification of the '613 Provisional patent application and as characterized with the figures therein.

Various aspects may also be implemented using and/or in connection with embodiments disclosed in U.S. Provisional Patent Application Ser. No. 62/745,118, entitled "Apparatus for Monitoring the Position of an Electrostatically Driven Resonator and Method Therefor," to which priority is claimed and which is fully incorporated herein by reference. For instance, various embodiments are directed to an apparatus comprising elements in accordance with the Specification of the '118 Provisional Patent Application and the description in Appendices A and B therein (each hereby incorporated by reference); one such embodiment includes driving the micro-actuator via a first stator plate and receiving a signal for processing or analysis via a second stator plate wherein the middle or moving structure's electrical terminal is not used, and another such embodiment includes driving the micro-actuator via a first stator plate and receiving a signal for processing or analysis via a second stator plate wherein the middle or moving structure's electrical terminal is connected to one of the stator plates (e.g., the first or second stator plate); and yet another such embodiment includes driving the micro-actuator via a first stator plate and receiving a signal for processing or analysis via the middle or moving structure's electrical terminal, wherein the second stator plate's electrical terminal is not connected. Various embodiments are directed to methods as carried out in accordance with the Specification of the '118 Provisional Patent Application and the description in Appendices A and B therein.

One or more embodiments are directed to a system of measuring motion or displacement of a microactuator via providing a signal indicative of changes in capacitance of the microactuator that includes at least a first terminal and a second terminal comprising: a first signal generator operating at a first frequency that outputs a first signal and a second signal generator operating at a second frequency that outputs a second signal wherein the first frequency is lower than that of the second frequency. The first signal may be combined or added with the second signal to provide a composite signal. Various terminals may be implemented as follows. The composite signal is coupled to the first terminal of the microactuator, the second terminal of the microactuator is coupled to an input of a first amplifier, an output of the first amplifier is coupled to an input terminal of a first band pass filter circuit wherein the first band pass filter circuit passes a signal related to the second frequency, an output terminal of the first band pass filter circuit to an input terminal of an amplitude modulation demodulator/detector; and an output terminal of the amplitude modulation demodulator/detector is coupled to an input terminal of a filter bank wherein the filter bank includes a first low frequency filter and wherein the first low frequency filter includes an input terminal and an output terminal. The input terminal of the first low frequency filter is coupled to the output terminal of the amplitude modulation demodulator/detector. An output terminal of the first low frequency filter is coupled to a first terminal of a first low frequency phase detector. A signal related to the first signal generator is coupled to a second terminal of the first low frequency phase detector. A signal is output from and output terminal of the first low frequency phase detector, in which the output signal of the first low frequency phase detector is indicative of a phase modulation effect related to the displacement or motion of the microactuator.

In various implementations, an input of a second low frequency filter is coupled to the output terminal of the amplitude modulation demodulator/detector, and an output terminal of the second low frequency filter is coupled to a first terminal of a second low frequency phase detector. A signal related to the first signal generator to a second terminal of the second low frequency phase detector. A signal from an output terminal of the second low frequency phase detector is output, which is indicative of a phase modulation effect related to the displacement or motion of the microactuator, and wherein a frequency of the phase modulation effect includes a frequency related to a harmonic of the fundamental frequency of the first signal from the first signal generator.

In certain implementations, a fundamental frequency of the first generator referenced above is substantially equal to a dominant mode frequency of the microactuator or wherein the fundamental frequency of the first generator is substantially equal to a sub-mode mode frequency of the microactuator. In other implementations, the fundamental frequency of the first generator is substantially equal to a dominant mode frequency of the microactuator or wherein the fundamental frequency of the first generator is substantially equal to a sub-mode mode frequency of the microactuator.

In certain implementation, a first limiter circuit is included with the first low frequency phase detector and/or a second limiter circuit is included with the second low frequency phase detector.

In some embodiments, an input terminal of a second harmonic signal amplitude detector is coupled to the output terminal of the first low frequency filter terminal, and an output of the second harmonic signal amplitude detector provides a signal indicative of second harmonic displacement of the microactuator or wherein an output of the second harmonic signal amplitude detector provides a signal indicative of second harmonic motion of the microactuator.

Another embodiment is directed to a system for adjusting an oscillator to a resonant frequency of a microactuator via a feedback system. The system includes a first signal generator that includes a voltage controlled oscillator circuit comprising a voltage control input terminal to vary the frequency of the voltage controlled oscillator as a function of voltage into the voltage controlled input terminal, further comprising the first signal generator includes an output terminal that provides an oscillating signal, and a second signal generator of a second frequency that includes a second signal output terminal wherein the first frequency is less than the second frequency. A combiner includes a first input terminal, a second input terminal, and an output terminal. The first signal output terminal is coupled to the first input terminal of the combiner and coupling the second signal output terminal to the second input terminal of the combiner. The output terminal of the combiner is coupled to an input terminal of a first amplifier. An output of the first amplifier is coupled to an input of a first high frequency band pass filter. An output of the first high frequency band pass filter is coupled to a first input terminal of a phase detector. The output terminal of the voltage controlled oscillator is coupled to a second input terminal of the phase detector, and an output terminal of the phase detector is coupled to a first input terminal of a second amplifier. A reference voltage is coupled to a second input terminal of the second amplifier, and an output terminal of the second amplifier is coupled to the voltage control input terminal of the voltage controlled oscillator. The frequency voltage controlled oscillator output signal is adjusted to substantially a resonant frequency of the microactuator. The resonant frequency of the microactuator may, for example, include a dominant mode frequency or a sub-mode frequency.

Another embodiment is directed to a system for measuring amplitude modulation and or phase modulation related to displacement or deflection characteristic of the MEMS device or microactuator. A first signal and a second signal are coupled to a first terminal of the MEMS device or microactuator to induce deflection or displacement of the MEMS device or microactuator, wherein the frequency of the second signal is higher than the frequency of the first signal. An electrical signal, a MEMS capacitance signal, is coupled from the MEMS device or microactuator that is indicative of capacitance of the MEMS device or microactuator. The MEMS capacitance signal is coupled to a first demodulator to demodulate the MEMS capacitance signal whose frequency is at a frequency of the frequency of the second signal. A demodulated signal is produced from the first demodulator wherein the demodulated signal includes one or more signals with frequency or frequencies related to the first signal that may include frequency or frequencies of the fundamental and or harmonic of the first signal. The demodulated signal from the first demodulator is coupled to a spectrum analyzer, to a FFT (Fast Fourier Transform), to an input terminal of a second demodulator, and or to a first input terminal of a third demodulator. The second demodulator includes an amplitude modulation detector and or the third demodulator includes a phase modulation detector. The third demodulator includes a second input terminal that is coupled to the first signal. The second demodulator provides a demodulated signal indicative of amplitude modulation of displacement or deflection of the MEMS or microactuator, and or wherein the third demodulator provides a demodulated signals indicative of phase modulation of displacement or deflection of the MEMS or microactuator.

The system for measuring amplitude modulation and or phase modulation may be implemented as follows. In some embodiments, the first or second signal generator includes a voltage controlled oscillator for providing a frequency modulated signal. The first demodulator may be any combination of an amplitude modulation detector/demodulator, a phase detector/demodulator, or a frequency modulation detector/demodulator, and may include a frequency modulation detector/demodulator. A band pass filter may be coupled between an output terminal first demodulator and an input terminal of the second demodulator, wherein the band pass filter pass frequencies related to the fundamental frequency of the first signal. A band pass filter may be coupled between an output terminal first demodulator and an input terminal of the second demodulator wherein the band pass filter pass frequencies related to a harmonic frequency of the first signal.

This disclosure is illustrative and not limiting; further modifications will be apparent to one skilled in the art and are intended to fall within the scope of the appended claims and or of the embodiments described. For instance, various embodiments discussed as being implemented separately can be implemented together, and portions of discussed embodiments may be implemented separately. In this context, the various figures provided herewith may be implemented together, and different components within individual figures may be implemented separately. Moreover, various embodiments may involve those characterized in the underlying provisional applications to which priority is claimed and are fully incorporated herein by reference.

Terms to exemplify orientation, such as upper/lower, left/right, top/bottom and above/below, may be used herein to refer to relative positions of elements as shown in the figures. It should be understood that the terminology is used for notational convenience only and that in actual use the disclosed structures may be oriented different from the orientation shown in the figures. Thus, the terms should not be construed in a limiting manner.

The skilled artisan would recognize that various terminology as used in the Specification (including claims) connote a plain meaning in the art unless otherwise indicated. As examples, the Specification describes and/or illustrates aspects useful for implementing the claimed disclosure by way of various circuits or circuitry which may be illustrated as or using terms such as blocks, modules, device, system, unit, controller, function(s) and/or other circuit-type depictions (e.g., reference numerals 603 and 604 of FIG. 11 depicts a block/module as described herein). Such circuits or circuitry are used together with other elements to exemplify how certain embodiments may be carried out in the form or structures, steps, functions, operations, activities, etc. For example, in certain of the above-discussed embodiments, one or more modules are discrete logic circuits or programmable logic circuits configured and arranged for implementing these operations/activities. Depending on the application, the instructions (and/or configuration data) can be configured for implementation in logic circuitry, with the instructions (whether characterized in the form of object code, firmware or software) stored in and accessible from a memory (circuit). As another example, where the Specification may make reference to a "first [type of structure]", a "second [type of structure]", etc., where the [type of structure] might be replaced with terms such as ["circuit", "circuitry", "function" and others], the adjectives "first" and "second" are not used to connote any description of the structure or to provide any substantive meaning; rather, such adjectives are merely used for English-language antecedence to differentiate one such similarly-named structure from another similarly-named structure (e.g., "first circuit configured to convert . . . " is interpreted as "circuit configured to convert . . . ").

Based upon the above discussion and illustrations, those skilled in the art will readily recognize that various modifications and changes may be made to the various embodiments without strictly following the exemplary embodiments and applications illustrated and described herein. For example, methods as exemplified in the Figures may involve steps carried out in various orders, with one or more aspects of the embodiments herein retained, or may involve fewer or more steps. Such modifications do not depart from the true spirit and scope of various aspects of the disclosure, including aspects set forth in the claims.

What is claimed is:

1. An apparatus comprising:
a MEMS device including mechanical, electro-mechanical, and capacitive sections having a first terminal, a second terminal and a common terminal, wherein the MEMS device is to process electrical-signal stimulation via first and second signals of different frequencies respectively at the first terminal and the second terminal by providing an output signal at one of the group of the first terminal, the second terminal and the common terminal; and
filtering and processing circuitry configured and arranged to filter and process information derived from the output signal at the common terminal and to generate therefrom a signal indicative of changes in capacitance related to at least one of the first and second terminals of the MEMS device.

2. The apparatus of claim 1, wherein during operation the output signal is indicative of a nonlinearity associated with the capacitive sections.

3. The apparatus of claim 1, wherein during operation the output signal is indicative of a nonlinearity associated with the capacitive sections, and wherein the MEMS device is configured to respond to changes in amplitudes of or phases associated with the electrical-signal stimulation at the first terminal and the second terminal, and therein to cause accentuation of changes in capacitance as indicated in the generated signal.

4. The apparatus of claim 1, further including micromirrors coupled to or as part of the MEMS device, and wherein during operation resonance associated with the micromirrors or the MEMS device is configured as a function of the output signal.

5. The apparatus of claim 4, wherein the MEMS device is configured to increase a field of view provided by the micromirrors by at least two orders of magnitude, to facilitate the micromirrors being driven at a selected frequency, and to facilitate drive voltages for the MEMS device to be modulated in amplitude, phase, and/or frequency for optimized scan patterns, and wherein the output signal is provided at the common terminal.

6. The apparatus of claim 1, further including micromirrors coupled to or as part of the MEMS device, wherein the apparatus includes or refers to a LIDAR device and with the micromirrors being used in a LIDAR or laser microscopy application.

7. The apparatus of claim 1, further including micromirrors coupled to or as part of the MEMS device, wherein the apparatus includes or refers to a heads-up or mounted display and with the micromirrors being used for providing images in the heads-up or mounted display.

8. The apparatus of claim 1, wherein the MEMS device is to provide the output signal at one of the group of the first terminal and the second terminal.

9. The apparatus of claim 1, wherein the filtering and processing circuitry is configured to sense the changes in capacitance via the MEMS device without a signal being coupled from the common terminal to the filtering and processing circuitry.

10. The apparatus of claim 1, further including an amplifier integrated with the filtering and processing circuitry, wherein the MEMS device is to receive a composite signal at the first terminal and to provide the output signal at one of the group of the first terminal and the second terminal, wherein the composite signal includes a low frequency signal to drive the MEMS device and includes a higher frequency signal to facilitate capacitive sensing, wherein the filtering and processing circuitry is configured to sense the changes in capacitance via the MEMS device without a signal being coupled from the common terminal to the filtering and processing circuitry, and wherein the filtering and processing circuitry is to provide an output that includes an amplitude or phase modulated high frequency signal and a portion of the low frequency signal.

11. The apparatus of claim 10, further including a bandpass filter and a demodulator coupled to the bandpass filter, wherein the bandpass filter is to filter the output that includes an amplitude or phase modulated high frequency signal and a portion of the low frequency signal and therein provide a filtered output having a portion of the low frequency signal being attenuated, and wherein the bandpass filter is to provide an output signal for coupling to the demodulator to provide a signal indicative of a substantially instantaneous capacitance of the MEMS device.

12. The apparatus of claim 11, further comprising a low pass filter to remove a high frequency signal from the demodulator.

13. The apparatus of claim 1, wherein the output signal is provided at the common terminal, and
the filtering and processing circuitry is further configured and arranged to
filter, in response to a first combined signal at the first terminal, a signal from an output terminal and in response detect a measure of a first capacitance of the MEMS device,
filter, in response to a second combined signal at the second terminal, a second signal from the output terminal and in response detect a measure of a second capacitance of the MEMS device.

14. The apparatus of claim 13, wherein the filtering and processing circuitry are to filter the respective signals filtered from the first and second terminals by passing signals at respectively different sets of frequencies.

15. The apparatus of claim 12, wherein the filtering and processing circuitry includes at least one of the group of a synchronous detector and an amplitude modulation detector.

16. The apparatus of claim 1, further including a first signal source to operate at a first frequency and to be coupled to the first terminal, and a second signal source to operate at a second frequency and to be coupled to the first terminal, a third signal source to operate a third frequency and to be coupled to the second terminal, and a fourth signal source to operate at a fourth frequency and to be coupled to the second terminal, wherein during operation the common terminal is coupled to an input terminal of the filtering and processing circuitry, and wherein the filtering and processing circuitry includes an input terminal coupled to the common terminal and further includes an output terminal at which the signal indicative of changes in capacitance is provided.

17. An apparatus comprising:
a MEMS device including mechanical, electro-mechanical, and capacitive portions, and including a first terminal, a second terminal, and a first common terminal;
a first signal source configured and arranged to operate at a first frequency and to output a first signal;
a second signal source configured and arranged to operate at a second frequency and to output a second signal, wherein the first frequency is lower than the second frequency;
a third signal source configured and arranged to operate at a third frequency and to output a third signal;

a fourth signal source configured and arranged to operate at a fourth frequency and to output a fourth signal, wherein the third frequency is lower than the fourth frequency;

circuitry configured and arranged to combine the first signal with the second signal to form a first combined signal, wherein the first combined signal is coupled to the first terminal of the MEMS device;

circuitry configured and arranged to combine the third signal with the fourth signal to form a second combined signal, wherein the second combined signal is coupled to the second terminal of the MEMS device;

wherein the first common terminal is configured to produce an output respectively associated with the second and fourth frequencies; and filtering and processing circuitry configured and arranged to filter and process information derived from the produced output and generate therefrom a signal indicative of changes in capacitance related to the second terminal of the MEMS device.

18. The MEMS device of claim 17, wherein the processing circuitry is further configured and arranged to detect the amplitude of a signal being processed.

19. The MEMS device of claim 17, wherein the processing circuitry is further configured and arranged to detect the phase of a signal being processed.

20. The MEMS device of claim 19, wherein the mechanical portion includes a micromirror and the processing circuitry configured to detect the phase of the signal being processed is configured to determine an angular and linear position of the micromirror while the micromirror is driven by a signal exhibiting modulation selected from the group of: drive amplitude modulation, phase modulation, frequency modulation, and a combination thereof.

21. A MEMS apparatus comprising:
a mechanical component, including a capacitive portion, configured and arranged to actuate in response to an input signal;
circuitry configured and arranged to actuate the mechanical component by modulating the input signal via signal modulation selected as one or more from among the following: drive amplitude modulation, phase modulation, frequency modulation, and a combination thereof; and
circuitry configured and arranged to determine an angular and linear position of the mechanical component based on the phase of the input signal.

22. The apparatus of claim 21, further including circuitry to process or amplify signals, responsive to reaction of the capacitive portion to the input signal, indicative of capacitive changes and/or movements of the MEMS apparatus.

23. The apparatus of claim 21, wherein the capacitive portion includes opposing terminals and a common terminal configured and arranged to provide an output signal which is indicative of capacitive changes and/or movements of the MEMS apparatus.

24. The apparatus of claim 21, wherein in operation, the MEMS apparatus is modulated in amplitude, phase, and/or frequency for providing optimized scan patterns.

25. An apparatus for use with a MEMS device including mechanical, electro-mechanical, and capacitive sections having a first terminal, a second terminal and a common terminal, the apparatus comprising:
filtering and processing circuitry configured to filter and process information while the MEMS device processes electrical-signal stimulation via first and second signals of different frequencies respectively at the first terminal and the second terminal by providing an output signal at one of the group of the first terminal, the second terminal and the common terminal, wherein the filtering and processing circuitry is to derive the information from the output signal at the common terminal and is to generate therefrom a signal indicative of changes in capacitance related to at least one of the first and second terminals of the MEMS device.

26. The apparatus of claim 25, wherein in operation, the electrical-signal stimulation is to facilitate the MEMS apparatus being modulated in amplitude, phase, and/or frequency for optimized scan patterns.

* * * * *